US012777669B2

(12) United States Patent
Liang et al.

(10) Patent No.: US 12,777,669 B2
(45) Date of Patent: Oct. 27, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Pin-Chu Liang, Hsinchu (TW); Hsueh-Chang Sung, Hsinchu County (TW); Chii-Horng Li, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 446 days.

(21) Appl. No.: 18/363,627

(22) Filed: Aug. 1, 2023

(65) Prior Publication Data

US 2025/0048666 A1 Feb. 6, 2025

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |
| ***H10P 50/28*** | (2026.01) |

(52) U.S. Cl.

CPC ......... *H10D 30/43* (2025.01); *H10D 30/6735* (2025.01); *H10D 62/121* (2025.01); *H10D 64/017* (2025.01); *H10D 84/0151* (2025.01); *H10D 84/038* (2025.01); *H10D 84/83* (2025.01); *H10P 50/28* (2026.01)

(58) Field of Classification Search

CPC .. H10D 30/43; H10D 62/121; H10D 84/0151; H10D 84/83; H10D 30/014; H10D 30/6757; H10D 62/151; H10D 30/6735; H10D 64/017; H10D 84/038; H01L 21/311

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Ismail A Muse
(74) *Attorney, Agent, or Firm* — Maschoff Brennan

(57) ABSTRACT

A method for manufacturing a semiconductor device is provided. The method includes forming an epitaxial stack over a substrate, the epitaxial stack comprising alternating sacrificial layers and channel layers; patterning the epitaxial stack into a first fin and a second fin; forming a dielectric wall between the first and second fins; forming a dielectric structure surrounding the first and second fins; depositing a protection layer over the first and second fins; after depositing the protection layer, etching back the dielectric structure to exposes sidewalls of the sacrificial layers; and replacing the sacrificial layers with a gate structure.

20 Claims, 32 Drawing Sheets

(56) References Cited

U.S. PATENT DOCUMENTS

| | | | | |
|---|---|---|---|---|
| 9,608,116 | B2 | 3/2017 | Ching et al. | |
| 2021/0343600 | A1* | 11/2021 | Chen | H10D 30/6757 |
| 2022/0093471 | A1* | 3/2022 | Pan | H10D 84/038 |
| 2022/0208989 | A1* | 6/2022 | Wang | H10D 30/0243 |
| 2022/0230923 | A1* | 7/2022 | More | H10D 62/121 |
| 2022/0406779 | A1* | 12/2022 | Shin | H10D 30/6757 |
| 2024/0379795 | A1* | 11/2024 | Park | H10D 62/121 |

* cited by examiner

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
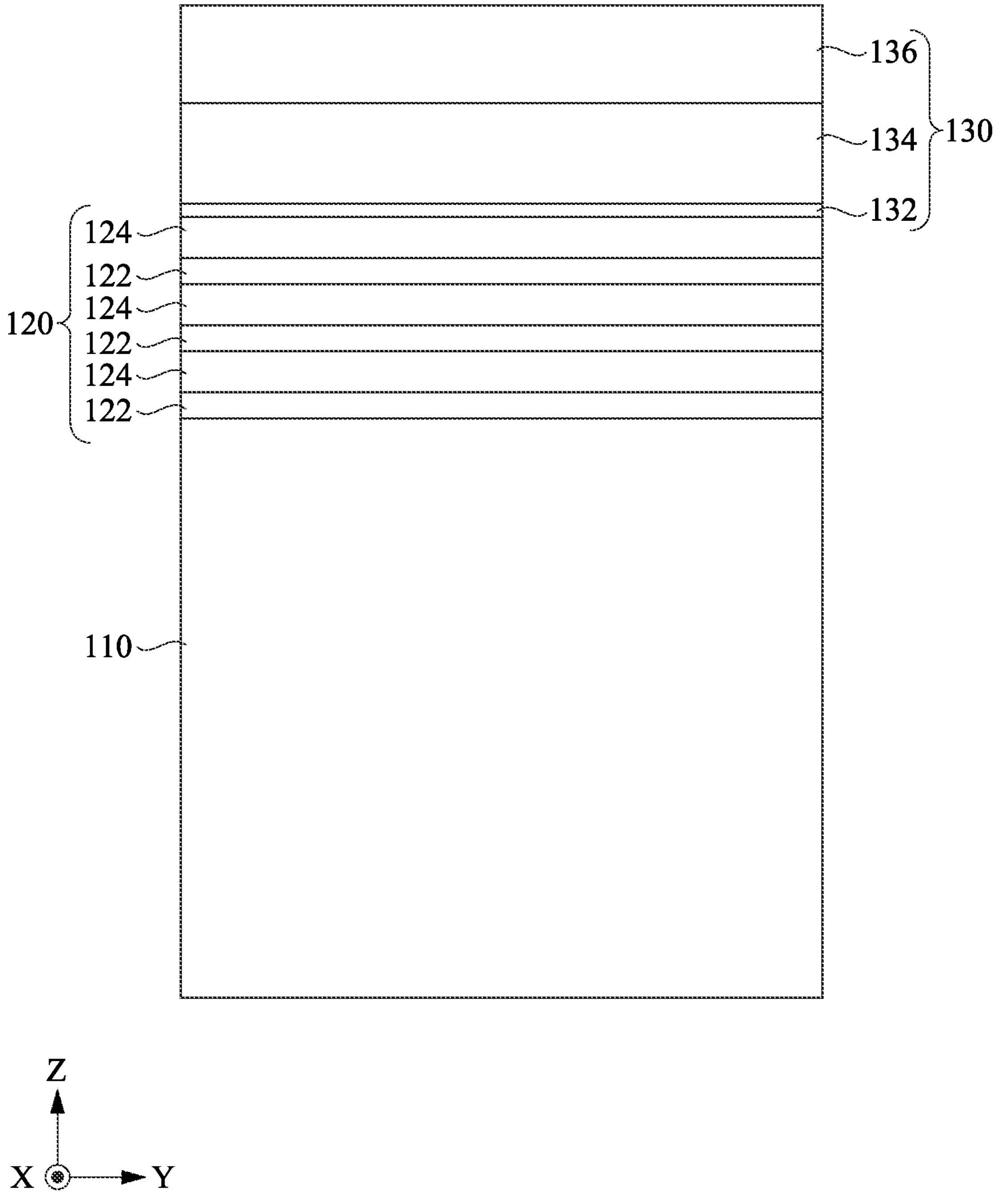
FIGS. 1-13D illustrate top and cross-sectional views of intermediate stages in the manufacture of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, “around,” “about,” “approximately,” or “substantially” may generally mean within 20 percent, or within 10 percent, or within 5 percent of a given value or range. Numerical quantities given herein are approximate, meaning that the term “around,” “about,” “approximately,” or “substantially” can be inferred if not expressly stated. One skilled in the art will realize, however, that the values or ranges recited throughout the description are merely examples, and may be reduced or varied with the down-scaling of the integrated circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term “multi-gate device” is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a “nanowire,” which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIGS. 1-13D illustrate top and cross-sectional views of intermediate stages in the manufacture of a semiconductor device in accordance with some embodiments of the present disclosure. FIGS. 2A, 4A, 5A, 10A, 11A, 12A, and 13A are top views of the integrated circuit device at various manufacturing stages in accordance with some embodiments. FIGS. 1, 2B, 3, 4B, 5B, 6-9, 10B, 11B, 12B, and 13B, are cross-sectional views of the integrated circuit device (e.g., taken along line Y-Y in FIGS. 2A, 4A, 5A, 10A, 11A, 12A, and 13A) at various manufacturing stages in accordance with some embodiments. FIGS. 10C, 11C, 12C, and 13C are cross-sectional views of the integrated circuit device (e.g., taken along line X-X in FIGS. 10A, 11A, 12A, and 13A) at various manufacturing stages in accordance with some embodiments. It is understood that additional steps may be provided before, during, and after the steps shown in FIGS. 1-13D, and some of the steps described below can be replaced or eliminated for additional embodiments of the method. The order of the operations/processes may be interchangeable.

Reference is made to FIG. 1. An epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes sacrificial layers 122 interposed by channel layers 124. The sacrificial layers 122 and the channel layers 124 may have different semiconductor compositions from each other. In some embodiments, the sacrificial layers 122 and the channel layers 124 may include SiGe with different semiconductor compositions. For example, a Si concentration in the sacrificial layers 122 is less than a Si concentration in the channel layers 124. Stated differently, in the embodiments, a Ge concentration in the sacrificial layers 122 is greater than a Ge concentration in the channel layers 124. For example, the sacrificial layers 122 are $Si_xGe_{1-x}$, and the channel layers 124 are $Si_yGe_{1-y}$, in which x and y are in a range from 0 to 1, and y>x. However, other embodiments are possible including those that provide for the material/compositions having different oxidation rates and/or etch selectivity. In some embodiments where the sacrificial layers 122 include SiGe and the channel layers 124 include Si, the Si oxidation rate of the channel layers 124 is less than the SiGe oxidation rate of the sacrificial layers 122.

The channel layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel layers 124 may be referred to as semiconductor channels in the context. The use of the channel layers 124 to define a channel or channels of a device is further discussed below.

In the present embodiments, three layers of the sacrificial layers 122 and three layers of the channel layers 124 are alternately arranged as illustrated in FIG. 1. It can be appreciated that any number of epitaxial layers can be formed in the epitaxial stack 120; the number of layers depending on the desired number of channels regions for the transistor. In some embodiments, the number of channel layers 124 is between 1 and 10. The sacrificial layers 122 in channel regions(s) may eventually be removed and serve to define a vertical distance between adjacent channel region(s) for a subsequently-formed multi-gate device. The thickness of the layers 122 and 124 may be in a range from about 3 nanometers to about 15 nanometers. If the thickness is less than about 3 nanometers, it may be difficult to release channel and fill gaps between the channels, which may result in defect in devices. If the thickness is greater than about 15 nanometers, gate and channels of the device may be enlarged unnecessarily, which may result in poor gate control. In the present embodiments, the sacrificial layer 122 may have a thickness equal to or less than that of the channel layers 124. In some other embodiments, the sacrificial layer 122 may have a thickness greater than that of the channel layers 124.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the channel layers 124 include suitable semiconductor material, such as like Si, Ge, Sn, SiGe, GeSn, III-V semiconductor, the like, or the combination thereof. In some embodiments, the channel layers 124 may include a same semiconductor material as that substrate 110. In some embodiments, the epitaxially grown sacrificial layers 122 include a different material than the substrate 110. For example, the sacrificial layers 122 include suitable semiconductor material, such as Si, Ge, SiGe, GeSn, III-V semiconductor, the like, or the combination thereof. In some other embodiments, at least one of the layers 122 and 124 may include other materials such as a compound semiconductor such as silicon carbide, gallium arsenide, gallium phosphide, indium phosphide, indium arsenide, and/or indium antimonide, an alloy semiconductor such as GaAsP. AlInAs, AlGaAs, InGaAs, GaInP, and/or GaInAsP, or combinations thereof. As discussed, the materials of the layers 122 and 124 may be chosen based on providing differing oxidation and/or etching selectivity properties. In some embodiments, the layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 2A:
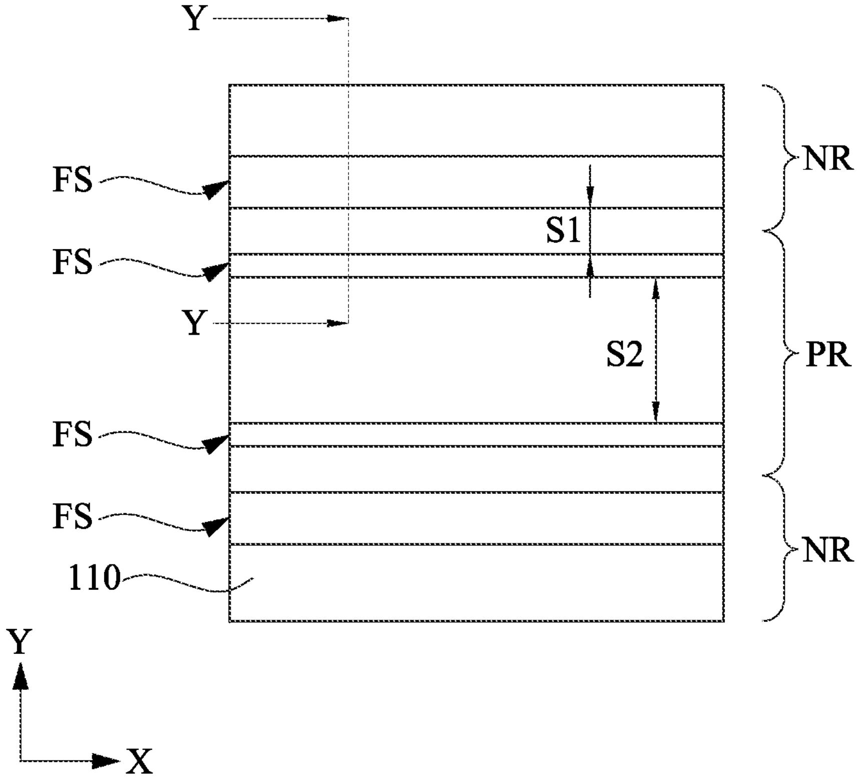
Figure 2B:
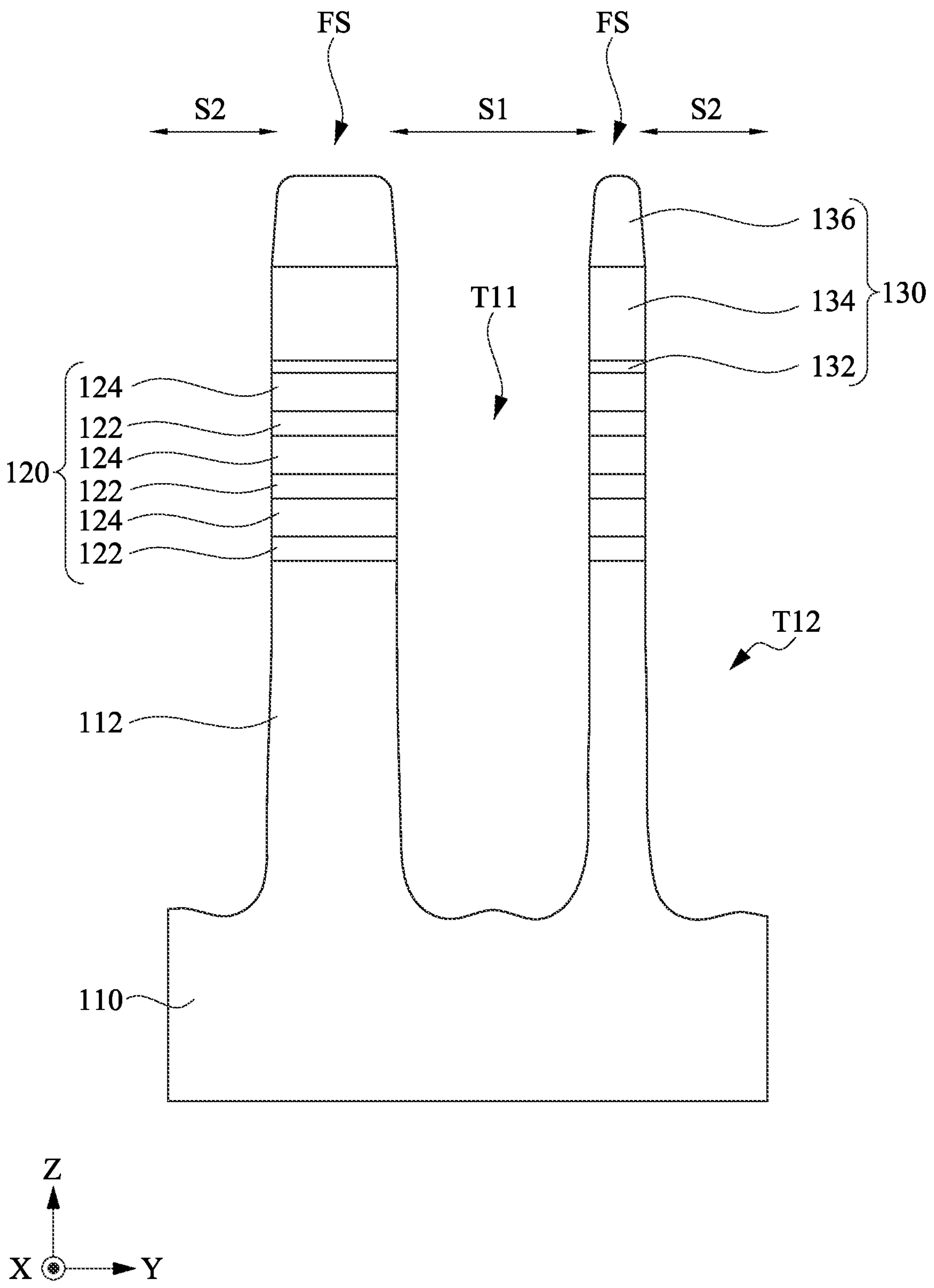

Reference is made to FIGS. 2A and 2B. A plurality of semiconductor fins FS extending from the substrate 110 are formed. The semiconductor fins FS may extend substantially along a same direction X. In various embodiments, each of the fins FS includes a substrate portion 112 formed from the substrate 110 and portions of each of the epitaxial layers of the epitaxial stack 120 including epitaxial layers 122 and 124. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

In the embodiments as illustrated in FIGS. 1 and 2B, a hard mask (HM) layer 130 is formed over the epitaxial stack 120 prior to patterning the fins FS. In some embodiments, the HM layer 130 includes an oxide layer 132 (e.g., a pad oxide layer that may include $SiO_2$), a nitride layer 134 (e.g., a pad nitride layer that may include $Si_3N_4$) formed over the oxide layer 132, and an oxide layer 136 (e.g., $SiO_2$) formed over the nitride layer 134. The oxide layer 132 may act as an adhesion layer between the epitaxial stack 120 and the nitride layer 134 and may act as an etch stop layer for etching the nitride layer 134. In some examples, the HM oxide layer 132 includes thermally grown oxide, chemical vapor deposition (CVD)-deposited oxide, and/or atomic layer deposition (ALD)-deposited oxide. In some embodiments, the HM nitride layer 134 is deposited on the HM oxide layer 132 by CVD and/or other suitable techniques. In some embodiments, the HM oxide layer 136 is deposited on the HM nitride layer 134 by CVD and/or other suitable techniques.

The fins FS may subsequently be fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T11 and T12 in unprotected regions through the HM layer 130, through the epitaxial stack 120, and into the substrate 110, thereby leaving the plurality of extending fins FS. The trenches T11 and T12 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS.

In some embodiments, the formed fins FS may be paired. Each pair of the fins FS may have a first spacing S1 therebetween, and two neighboring pairs of the fins FS may have a second spacing S2 therebetween, in which the second spacing S2 is greater than the first spacing S1. For example, each of the trenches T11 is located between a pair of fins FS, and the trenches T12 is located between two neighboring pairs of the fins FS, in which the trenches T11 is narrower than the trenches T12. In some embodiments, the fins FS may have different widths. For example, in the illustrated embodiments, the fins FS in n-type regions NR where n-type devices are formed are wider than the fins FS in a p-type region PR where p-type devices are formed.

Figure 3:
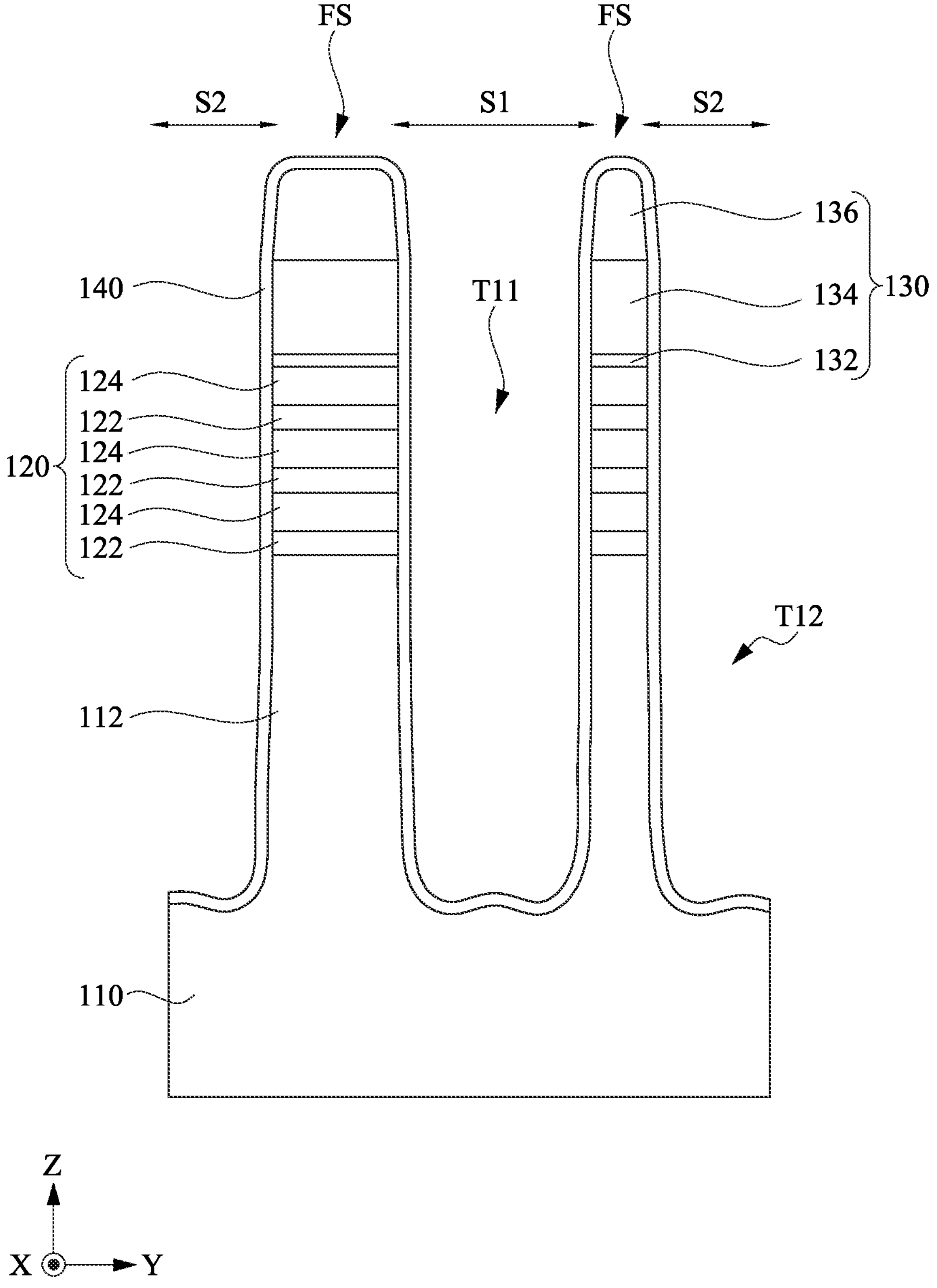

Reference is made to FIG. 3. A dielectric liner 140 is formed in sequence on the fins FS and the HM layer 130. For example, the dielectric liner 140 is conformally deposited on the structure in FIGS. 2A and 2B using CVD, ALD, or a suitable method. The dielectric liner 140 lines sidewalls and bottom surface of the trenches T11 and T12. The dielectric liner 140 may include low-k dielectric materials. The dielectric liner 140 may be a single-layer or a multi-layer structure. In some embodiments, the dielectric liner 140 includes $SiO_2$, SiOC, SiOCN, the like, or the combination thereof. In some embodiments, prior to the formation of the dielectric liner 140, a semiconductor liner (e.g., a silicon liner) is conformally deposited to line sidewalls and bottom surface of the trenches T11 and T12. The semiconductor liner may space the fins FS and the substrate 110 from the dielectric liner 140. And, the semiconductor liner may be oxided to serve a portion of the dielectric liner 140 by suitable subsequent annealing process.

Figure 4A:
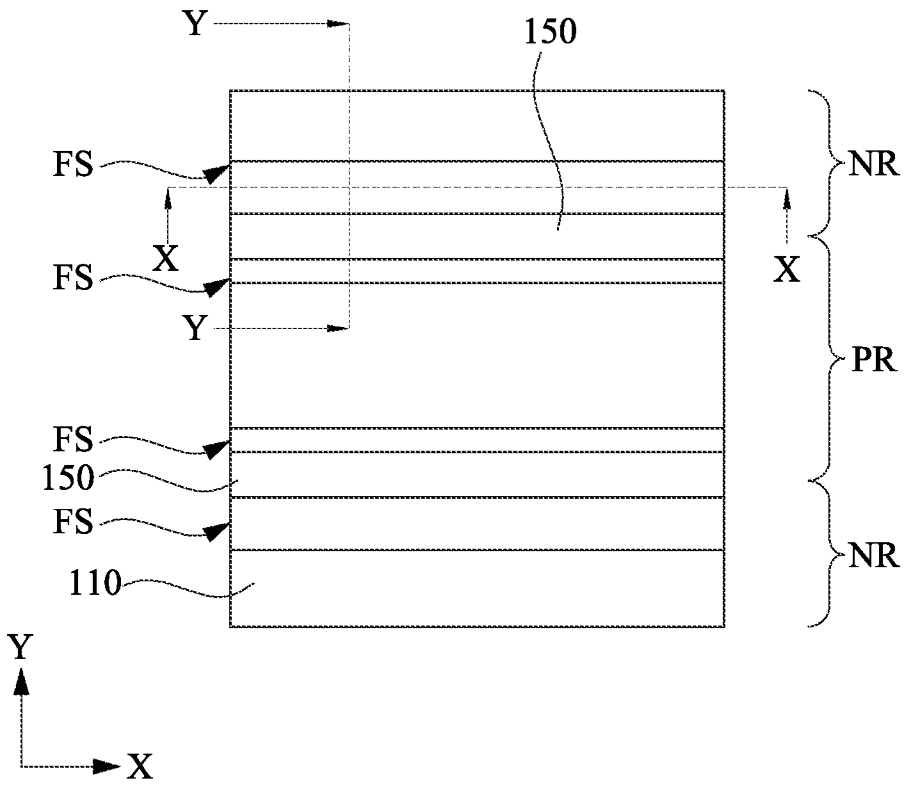
Figure 4B:
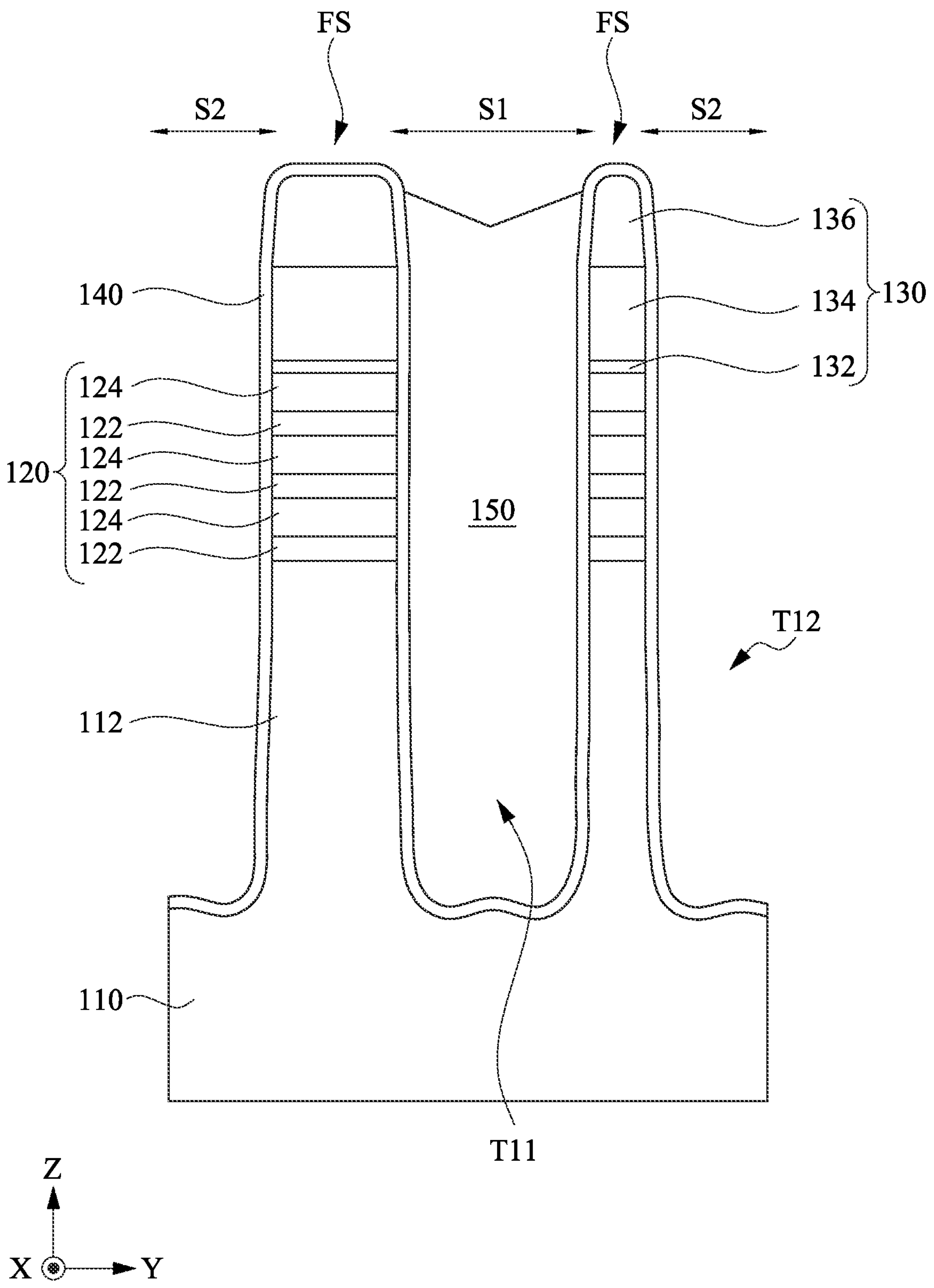

Reference is made to FIGS. 4A and 4B. A dielectric wall 150 is formed in the trench T11. The material of the dielectric wall 150 may be different from that of the dielectric liner 140. In some embodiments, the dielectric wall 150 includes SiN, SiCN, SiOC, SiOCN or the like. The dielectric wall 150 may be a single-layer or a multi-layer structure. Formation of the dielectric wall 150 includes conformally depositing a dielectric layer over the structure of FIG. 3, followed by an etch back process. Due to various spacing S1 and S2 between the fins FS, the deposited dielectric layer may completely fill the trench T11, which is narrower than the trench T12, but does not completely fill the trench T12. The etching back process is then performed to remove a top portion of the dielectric layer in the trenches T11 and completely remove the dielectric layer from the trenches T12. Unlike the narrower trench T11 which is entirely filled by the dielectric layer, the wider trenches T12 allow etchant to etch sidewalls and bottom surface of the dielectric layer from inside the trenches T12, such that the dielectric layer is removed from the wider trenches T12 in a faster rate than from the narrower trenches T11. The dielectric layer is removed from the wider trenches T12, while a portion of the dielectric layer remains in the narrower trenches T11 and forms the dielectric wall 150. After the etching back process, a top end of the dielectric wall 150 may be higher than a top surface of the epitaxial stack 120 and lower than a top surface of the HM layer 130.

Figure 5A:
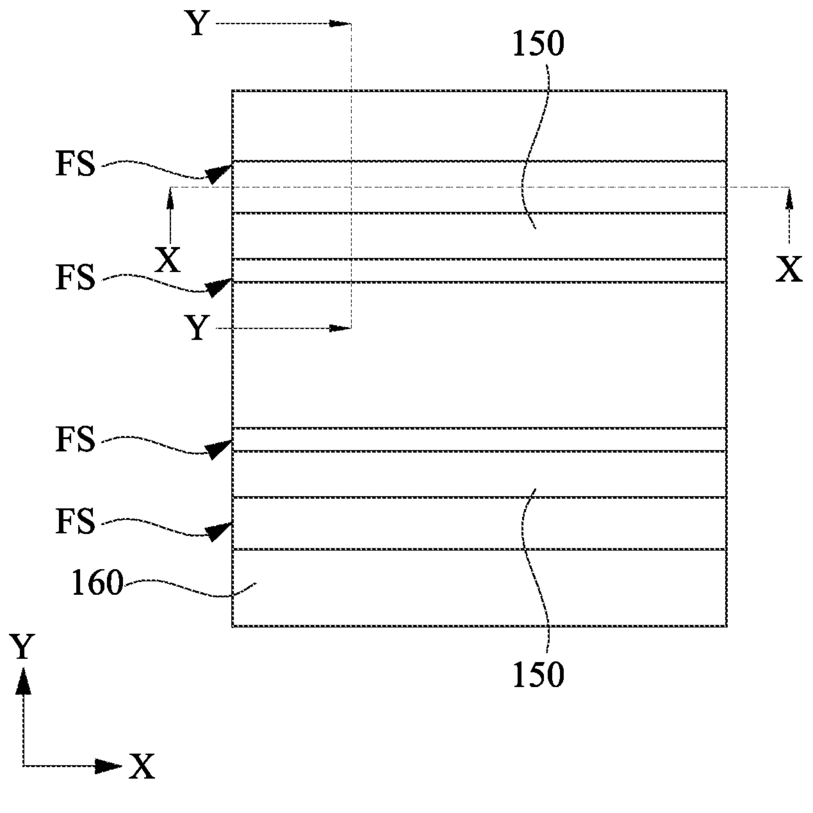
Figure 5B:
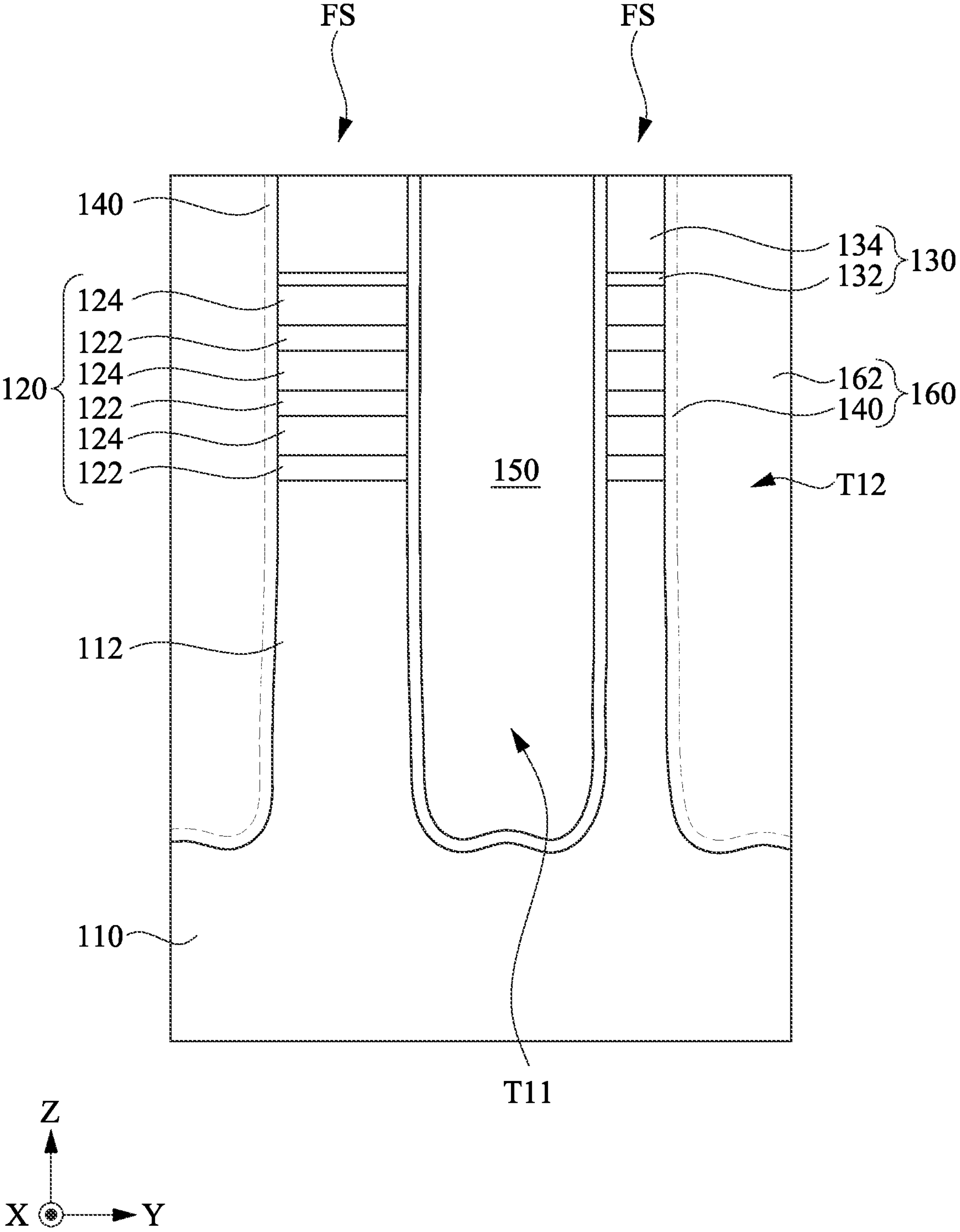

Reference is made to FIGS. 5A and 5B. A dielectric material 162 is formed over the substrate 110 and on opposing sides of the fins FS. The dielectric material 162 may include silicon oxide, silicon nitride, silicon oxynitride, fluorine-doped silicate glass (FSG), a low-k dielectric, combinations thereof, and/or other suitable materials. The dielectric material 162 may have materials different from the materials of the dielectric wall 150 to achieve etching selectivity. In some embodiments, the dielectric material 162 may have a same material as that of the dielectric liners 140 and the oxide layers 132. In various examples, the dielectric material 162 may be deposited by a CVD process, a subatmospheric CVD (SACVD) process, a flowable CVD process, an ALD process, a physical vapor deposition (PVD) process, and/or other suitable process. In some embodiments, the dielectric material 162 may include a multi-layer structure, for example, having one or more liner layers. Other dielectric materials formed by any acceptable process may be used. In the illustrated embodiments, the dielectric material 162 is silicon oxide formed by a FCVD process. An anneal process may be performed after the dielectric material 162 is formed.

In some embodiments, the dielectric material 162 is formed to overfill the trenches T12, such that excess dielectric material 162 covers the fins FS. Next, a planarization process is applied to the dielectric material 162 to remove excess dielectric material 162 and the dielectric liners 140 over the fins FS. The planarization process may include a chemical mechanical polish process (CMP). The oxide layers 136 of the HM layers 130 (referring to FIGS. 4A and 4B) are removed by the planarization process. The nitride layers 134 of the HM layers 130 may serve as a polish stop layer during the planarization process. Top surfaces of the nitride layers 134, the dielectric liners 140, the dielectric wall 150, and the dielectric material 162 are level after the planarization process is complete. An anneal process may be performed after the planarization process. In some embodiments, a combination of the dielectric material 162 and the dielectric liners 140 surrounding the dielectric material 162 may be referred to as a dielectric structure 160.

Figure 6:
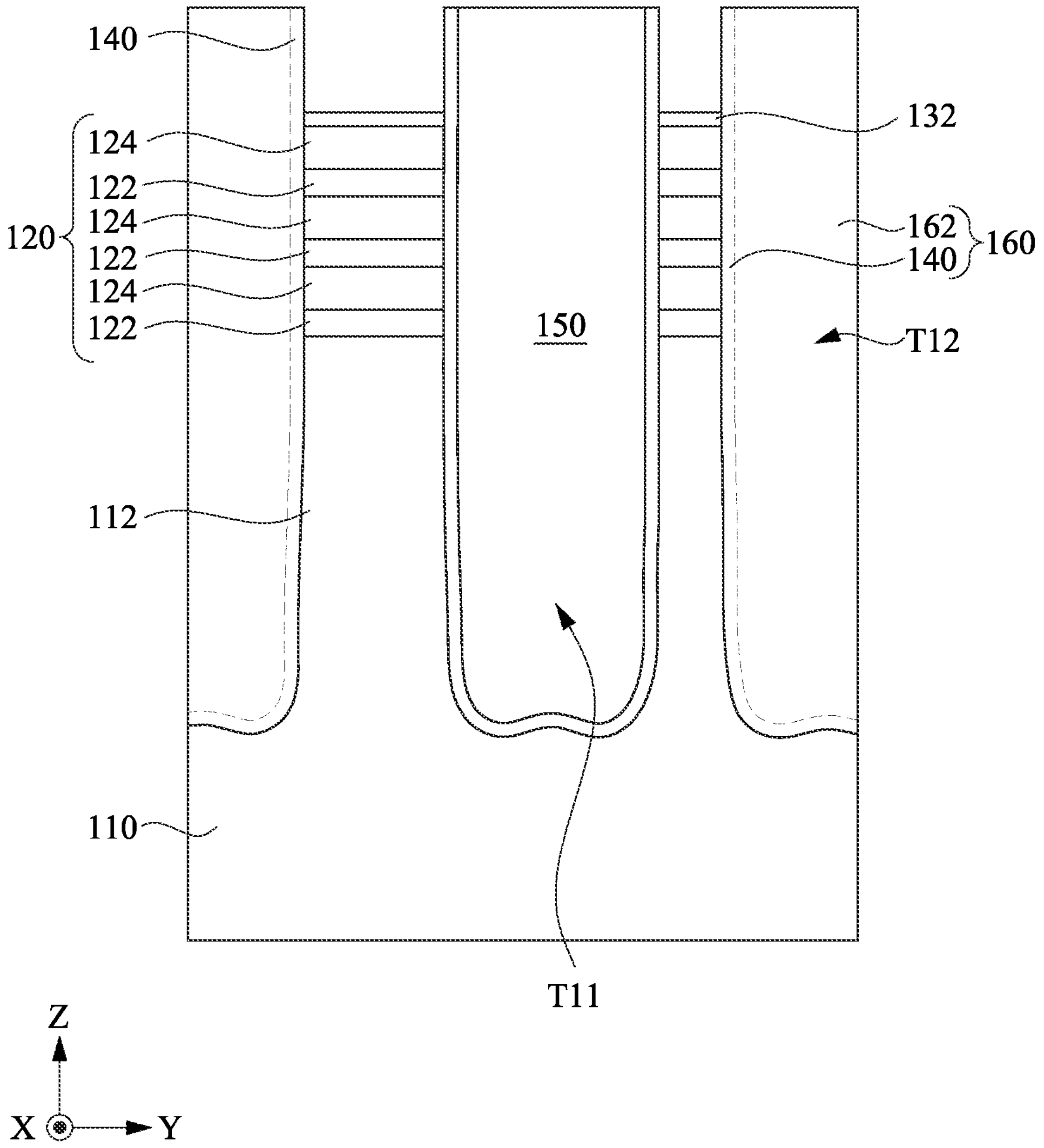

Reference is made to FIG. 6. The nitride layers 134 of the HM layers 130 (referring to FIGS. 5A and 5B) are removed by a wet cleaning/etching process. The oxide layers 132, the dielectric liners 140, the dielectric wall 150, and the dielectric structure 160, may have higher etch resistance to the wet cleaning/etching process than that of the nitride layers 134 of the HM layers 130 (referring to FIGS. 5A and 5B). Thus, the oxide layers 132 may serve as a etch stop layer during the wet cleaning/etching process, and the dielectric liners 140, the dielectric wall 150, and the dielectric structure 160 may remain substantially intact after the wet cleaning/etching process.

Figure 7:
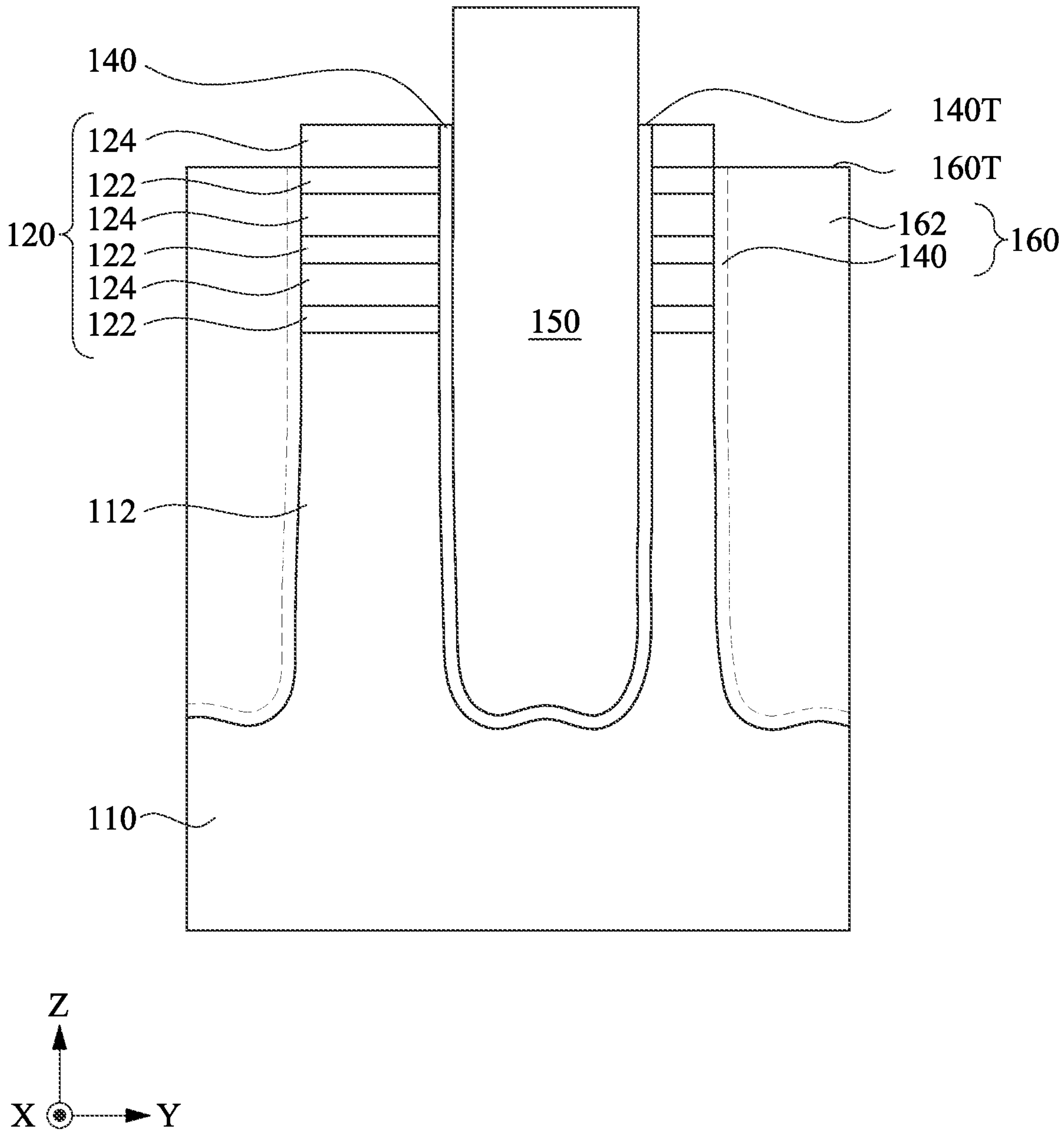

Reference is made to FIG. 7. An oxide cleaning process is performed to remove the oxide layers 132 (referring to FIG. 6), thereby exposing a top surface of the topmost channel layer 124, which in turn allow subsequent epitaxially growth of semiconductor materials. The oxide cleaning process may remove top portions of the dielectric liners 140 and top portions of the dielectric structure 160. The oxide cleaning process may be an dry etch process. The dielectric wall 150 and the channel layers 124 may have a higher etch resistance to the oxide cleaning process, and therefore not substantially communed by the oxide cleaning process.

After the oxide cleaning process, top surfaces 160T of the dielectric structure 160 may be lower than top surfaces of the topmost channel layers 124, thereby exposing sidewalls of the topmost channel layers 124. In the present embodiments, the top surfaces 160T of the dielectric structure 160 is substantially level with the topmost channel layers 124. In some alternative embodiments, the top surfaces 160T of the dielectric structure 160 may be substantially level with the topmost sacrificial layers 122. In still some alternative embodiments, the top surfaces 160T of the dielectric structure 160 may be substantially level with other channel layers 124 or other sacrificial layers 122.

The top ends 140T of the dielectric liners 140 may be substantially level with the top surfaces of the topmost channel layers 124 after the oxide cleaning process. In some other embodiments, the top ends 140T of the dielectric liners 140 may be lower than top surfaces of the topmost channel layers 124 and higher than bottom surfaces of the topmost channel layers 124. In some embodiments, due to the limited space exposing the top ends 140T of the dielectric liners 140, the top surfaces of the dielectric structure 160 may be lower than the top ends 140T of the dielectric liners 140. In some other embodiments, the top surfaces of the dielectric structure 160 may be level with the top ends 140T of the dielectric liners 140, and lower than the top surfaces of the topmost channel layers 124.

Figure 8:
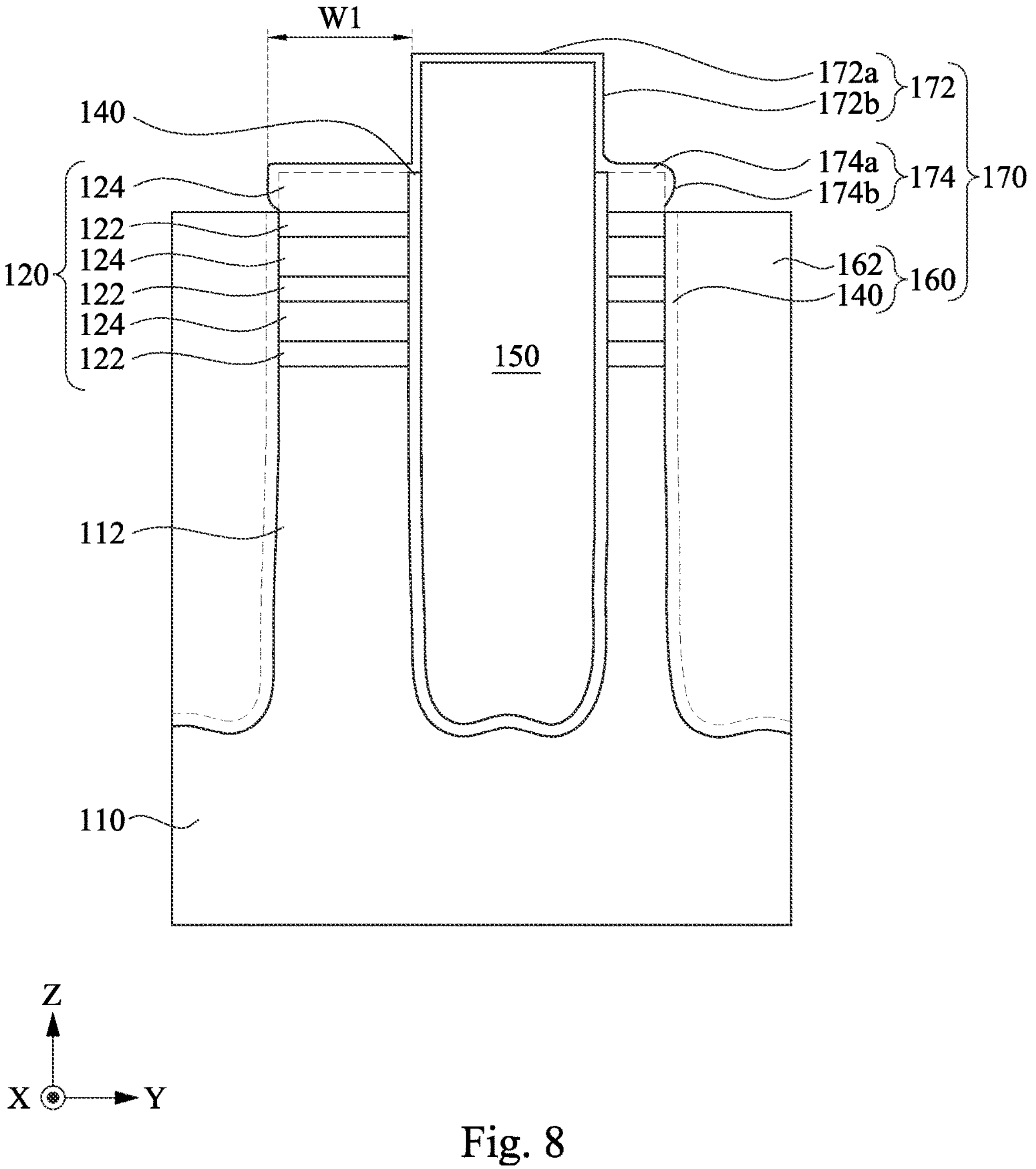

Reference is made to FIG. 8. A protection layer 170 is deposited over the exposed top surface and exposed sidewall of the topmost channel layer 124. The protection layer 170 may be any material having etch selectivity with oxide material. In some embodiments, the protection layer 170 may include a semiconductor material, such as Si, SiGe, the like, or the combination thereof. In some alternative embodiments, the protection layer 170 may include a dielectric material different from that of the dielectric structure 160. For example, the protection layer 170 may include a dielectric material, which may be free of oxygen, such as $Si_3N_4$. In some embodiments, it is easier to deposit a material of the protection layer 170 on surfaces of nitride materials and semiconductor materials than on a surface of oxide materials. For example, the protection layer 170 has a first portion 172 surrounding the dielectric wall 150 and a second portion 174 surrounding the exposed top surface and exposed sidewall of the topmost channel layer 124. And, the deposited protection layer 170 may have little or no material over the dielectric structure 160. The deposition of the protection layer 170 can be performed in-situ immediately following the oxide cleaning process depicted in FIG. 7. Stated differently, the oxide cleaning process in FIG. 7 and the deposition of the protection layer 170 are performed in a same chamber without the formation of additional native oxides.

In the embodiments where the protection layer 170 includes a semiconductor material, the first portion 172 of the protection layer 170 is amorphous, and the second portion 174 of the protection layer 170 is crystalline. For example, the amorphous portion 172 of the protection layer 170 has an amorphous part **172*a* over a top surface of the dielectric wall 150 and an amorphous part 172*b* on a sidewall of the dielectric wall 150. The crystalline portion 174 of the protection layer 170 has a crystalline part 174*a* over a top surface of the topmost channel layer 124 and a crystalline part 174*b* on a sidewall of the topmost channel layer 124 away from the dielectric wall 150. It may be found that the topmost sheet (e.g., a combination of the crystalline portion 174 and the topmost channel layer 124) has an overhang profile. For example, a width W1 of the topmost semiconductor sheet (e.g., a combination of the crystalline portion 174 and the topmost channel layer 124) is greater than a width W2 of the semiconductor sheets (e.g. the channel layer 124**) below the topmost sheet.

In some embodiments where the protection layer 170 is a silicon capping layer, the protection layer 170 may be deposited at a temperature in a range from about 300° C. to about 700° C., at a pressure in a range from about 0.1 torr to about 10 torr, and in an ambient environment of $SiH_4$, $Si_2H_6$, $GeH_4$, $H_2SiCl_2$, $Si_xH_{2x+2}$, high order silane, the like, or the combination thereof. If the protection layer 170 is deposited at a temperature below about 300° C. and/or at a pressure less than about 0.1 torr, the growth rate of the protection layer 170 may be too low, which resulted in reduced wafer per hour (WPH). If the protection layer 170 is deposited at a temperature above about 700° C. and/or at a pressure greater than about 10 torr, materials of the protection layer 170 may be deposited over the dielectric structure 160, such that top surfaces of the dielectric structure 160 may be not be lowered by subsequent etching back process.

Figure 9:
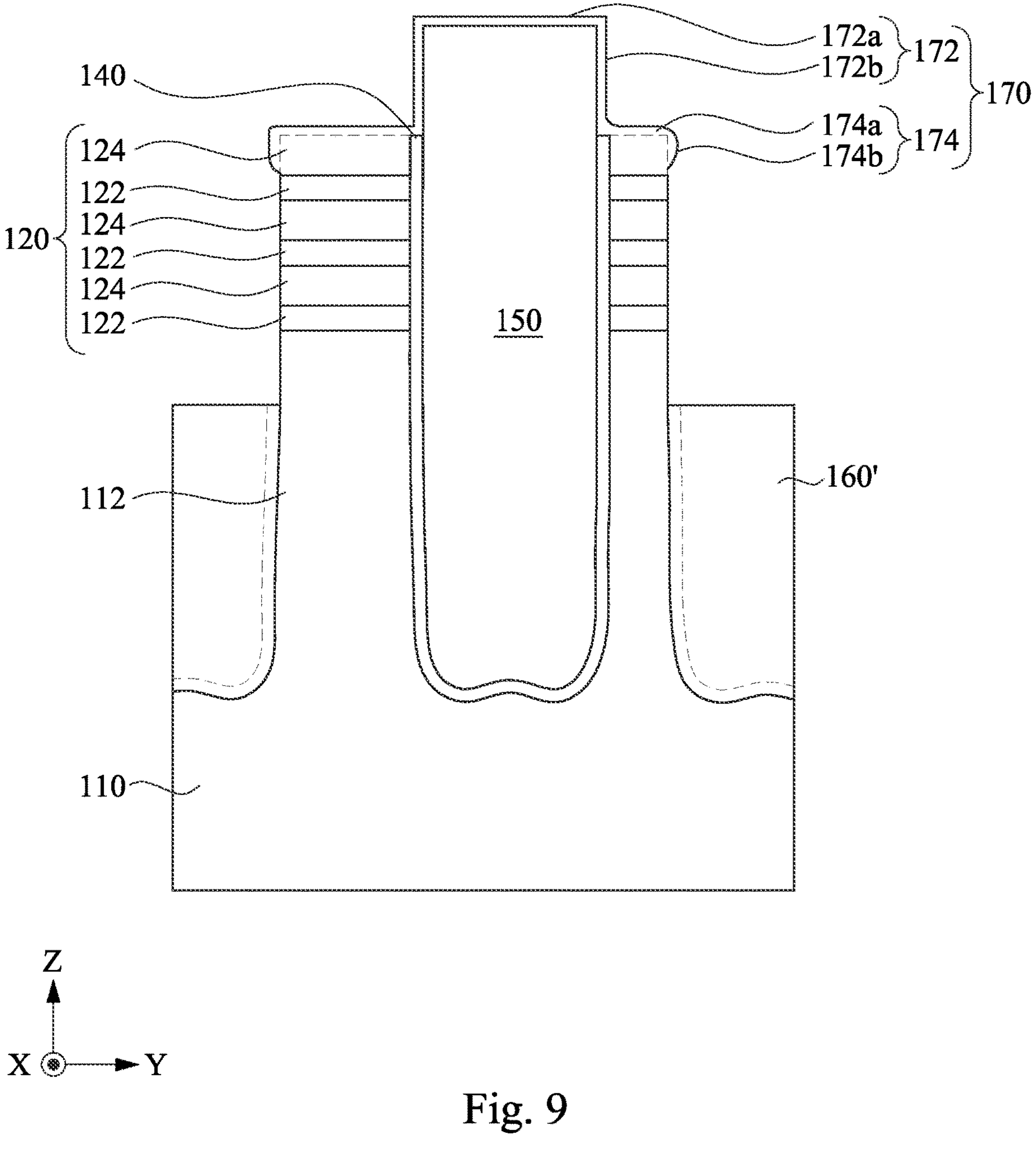

Reference is made to FIG. 9. An etching back process is performed to remove a top portion of the dielectric structure 160 (referring to FIG. 8) above the substrate portion 112, thereby recessing the dielectric structure 160 (referring to FIG. 8). In some embodiments, a recessing depth is controlled (e.g., by controlling an etching time) so as to result in a desired height of the exposed upper portion of the fins FS. In the illustrated embodiments, the desired height exposes each of the layers 122 and 124 of the epitaxial stack 120 in the fins FS. Due to the etch selectivity between the protection layer 170 and the dielectric structure 160 (referring to FIG. 8), the etching back process may not substantially damage the protection layer 170. The protection layer 170 may protect underlying topmost channel layer 124 and the dielectric liner 140 from being etched. After the etching back process, portions of the dielectric structure 160 (referring to FIG. 8) remain in the trenches T12 and interpose the fins FS. The remaining portions of the dielectric structure 160 (referring to FIG. 8) may be referred to as shallow trench isolation (STI) structures 160'.

In order to reduce charging effect between the channel layers 124 and the dielectric (SiCN) wall 150 for device performance, the dielectric (oxide) liner 140 was introduced to grow between the channel layers 124 and the dielectric (SiCN) wall 150. In absence of the protection layer 170, the dielectric liner 140 between the dielectric wall 150 and the channel layers 124 may be seriously recessed during STI recessing process, which may cause oxide dishing, which exposes a large area of the sidewalls of the channel layers 124 and the sacrificial layers 122 at wall side, resulting leakage and worsen the device performance.

In some embodiments of the present disclosure, with the protection of the protection layer 170 (referring to FIG. 8), the dielectric liner 140 between the dielectric wall 150 and the channel layers 124 is prevented from being etched during the etching back process in FIG. 9. Little or no area of the sidewalls of the channel layers 124 and the sacrificial layers 122 at wall side are exposed. Thus, the leakage issue can be addressed, thereby improving the device performance.

Figure 10A:
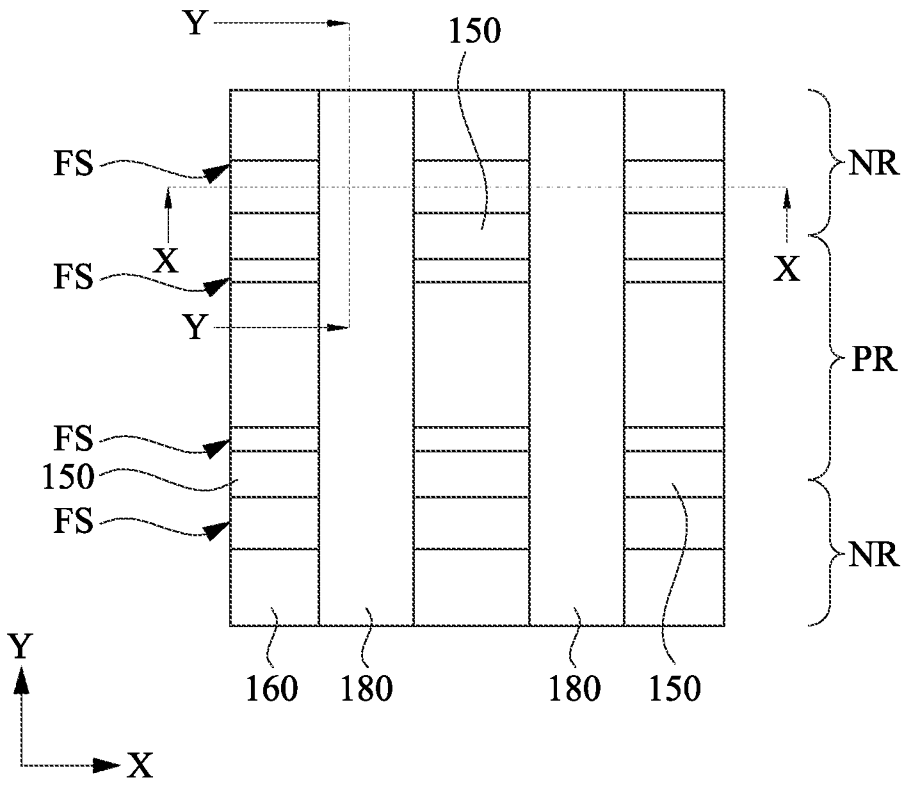
Figure 10B:
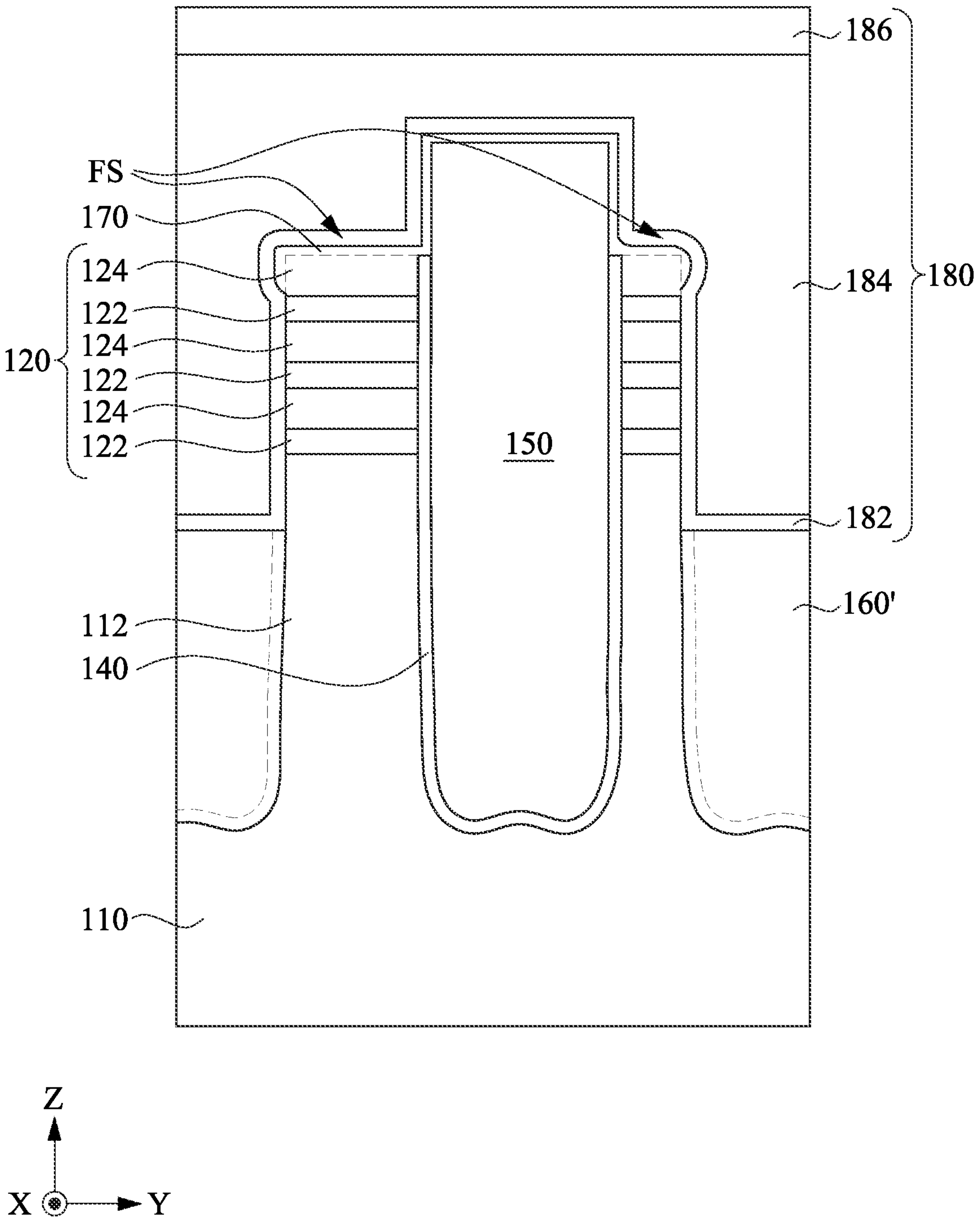
Figure 10C:
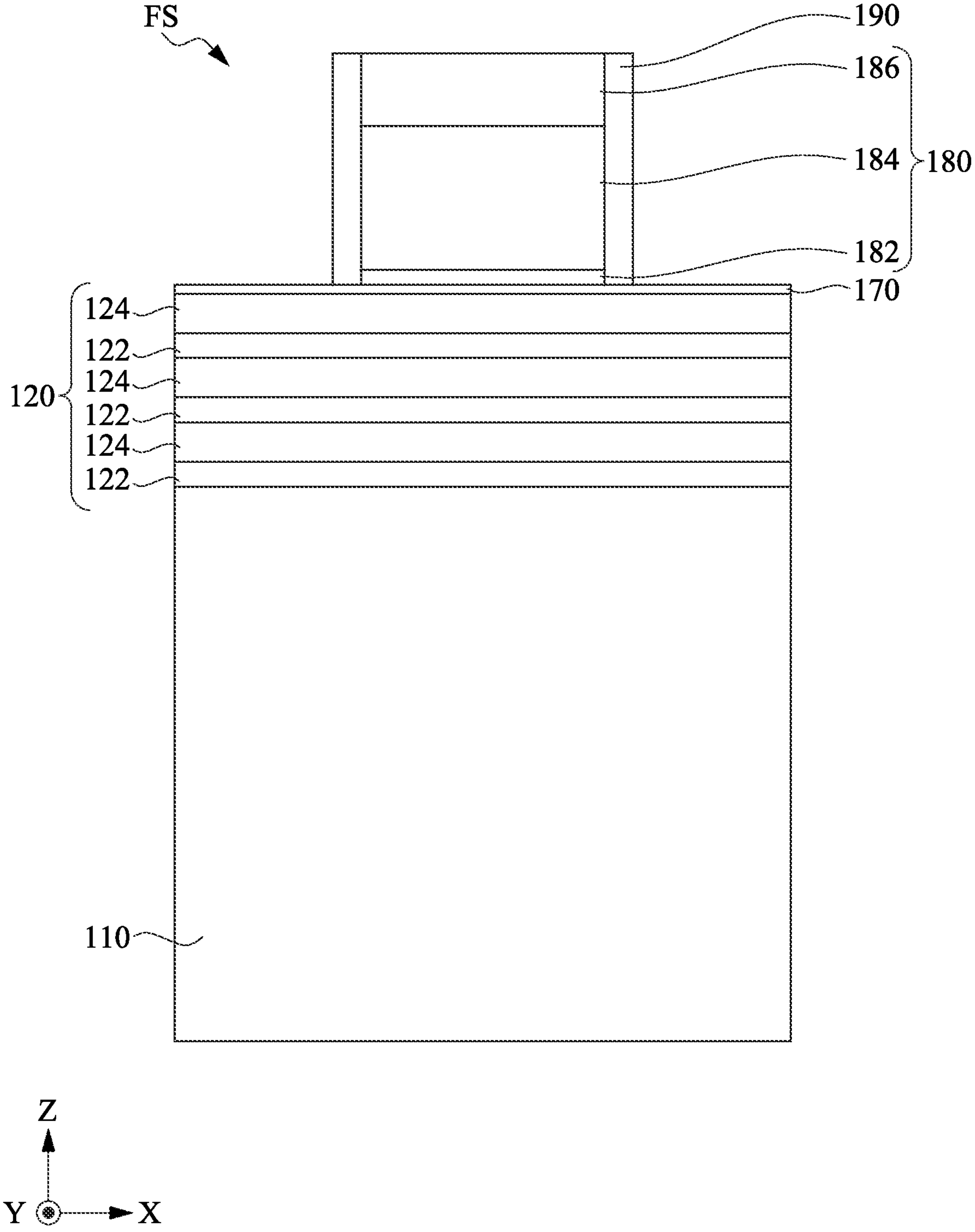

Reference is made to FIGS. 10A-10C. Gate structures 180 are formed over the substrate 110. The gate structure 180 may extend along a direction Y substantially perpendicular (within process variations) to the direction X that the fins FS extend along. In the context, portions of the fins FS underlying the gate structures 180 may be referred to as the channel regions. The gate structures 180 may also define a source/drain (S/D) region of the fins FS, for example, the regions of the fin FS adjacent to and on opposing sides of the channel region.

In some embodiments, the gate structures 180 are dummy (sacrificial) gate structures that are subsequently removed. Thus, in some embodiments using a gate-last process, the gate structures 180 are dummy gate structures and will be replaced by the final gate structures at a subsequent processing stage of the semiconductor device. In particular, the dummy gate structures 180 may be replaced at a later processing stage by a high-k dielectric layer (HK) and metal gate electrode (MG) as discussed below.

The dummy gate structures 180 may include a gate dielectric 182, a dummy gate electrode 184, and a hard mask 186. Formation of the dummy gate structures 180 may include layer formation/deposition process, lithography process, and etching process. For example, a gate dielectric layer, a dummy gate electrode layer, and a hard mask layer are formed over the structure of FIG. 9 in a sequence. The dummy gate dielectric layer may be formed of a dielectric material such as silicon oxide, silicon nitride, a combination thereof, or the like, which may be deposited or thermally grown according to acceptable techniques. The dummy gate electrode layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. In some embodiments, the hard mask layer may be formed of a dielectric material such as silicon nitride, silicon oxynitride, silicon oxycarbide (SiOC), silicon oxycarbonitride (SiOCN), the like, or a combination thereof.

The hard mask layer is patterned into the hard mask 186 by suitable lithography and etching processes. In the lithography process (e.g., photolithography or e-beam lithography) may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. Subsequently, a pattern of the hard mask 186 is transferred to the dummy gate electrode layer and the gate dielectric layer by any acceptable etching technique, thereby patterning the dummy gate electrode layer and the gate dielectric layer into the dummy gate electrode 184 and gate dielectric 182. In some embodiments, the etching process may include dry etching (e.g., RIE etching), wet etching, and/or other etching methods. After the patterning process, the dummy gate electrode 184 and the gate dielectric 182 covers portions of the fins FS, which will be exposed in subsequent processes to form channel regions.

After the formation of the dummy gate structures 180, gate spacers 190 are formed on sidewalls of the dummy gate structures 180. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 190. For example, an anisotropic etching process is performed on the deposited spacer material layer to expose portions of the fins FS not covered by the dummy gate structures 180 (e.g., in source/drain regions of the fins FS). Portions of the spacer material layer directly above the dummy gate structures 180 may be completely removed by this anisotropic etching process. In some embodiments, the spacer material layer includes multiple layers, and therefore the gate spacers 190 may be multi-layer structures.

Figure 11A:
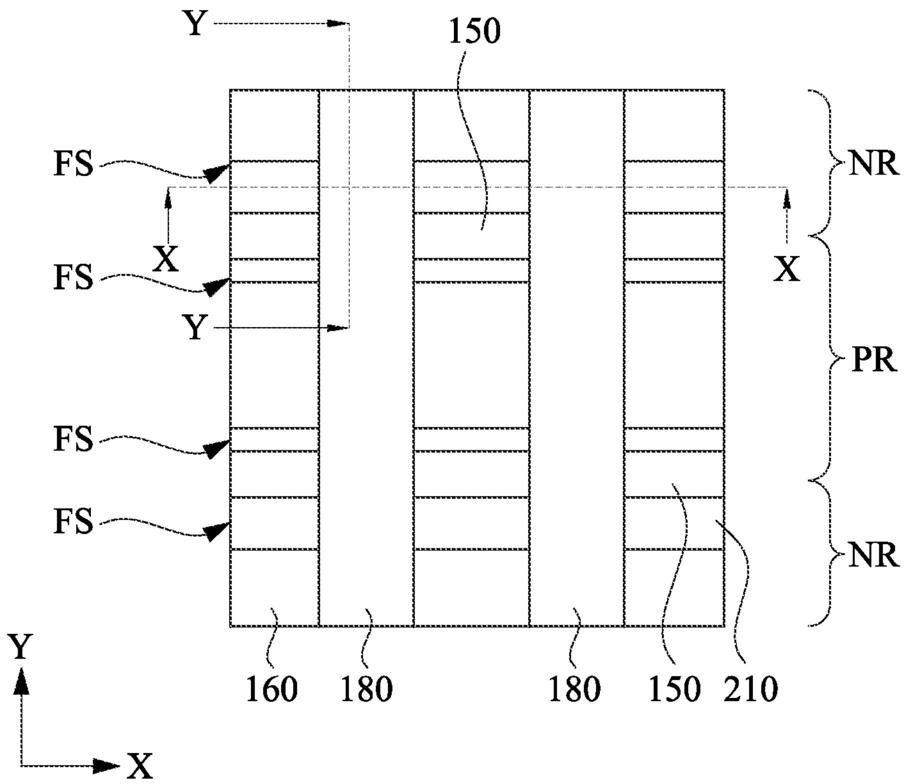
Figure 11B:
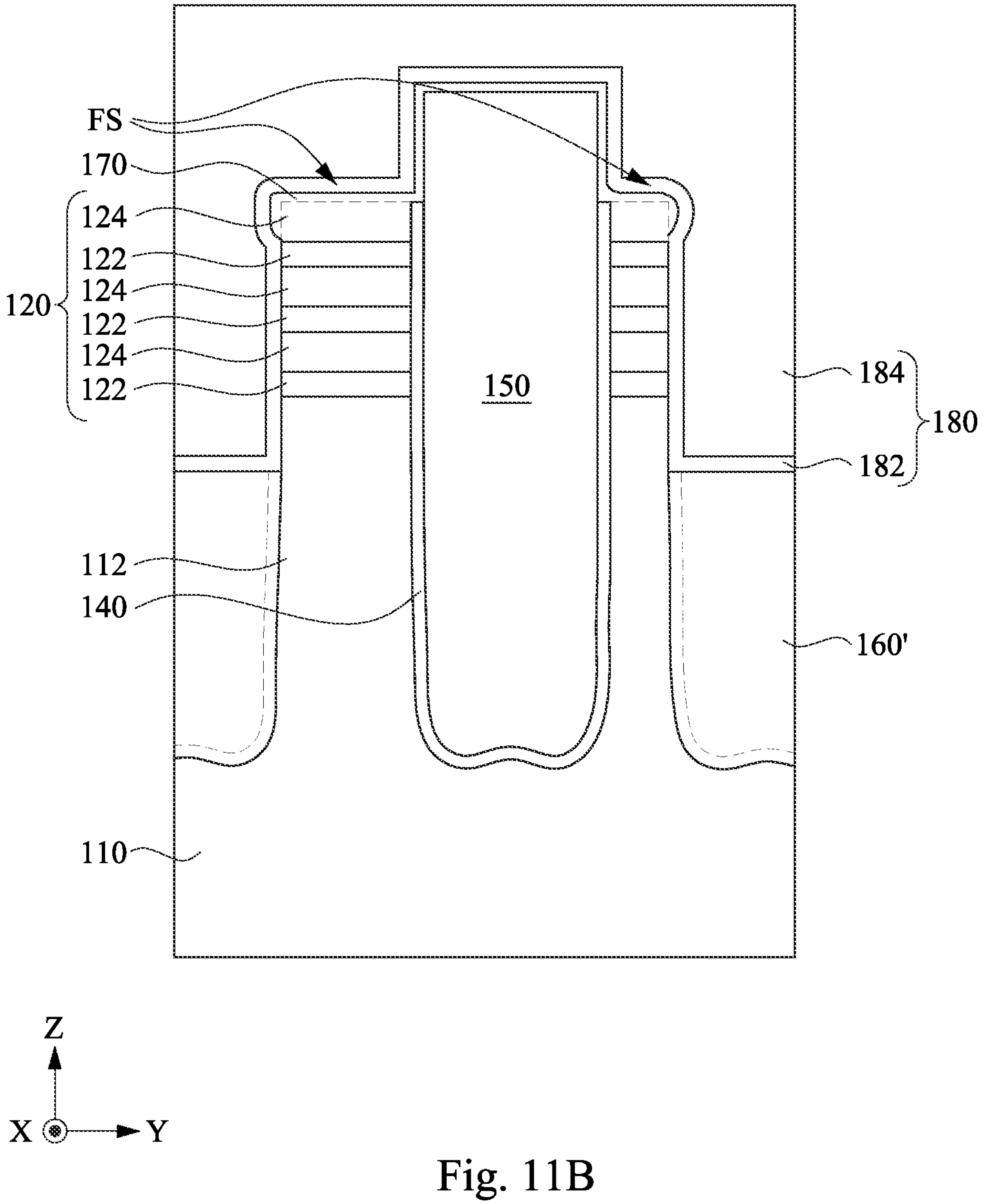
Figure 11C:
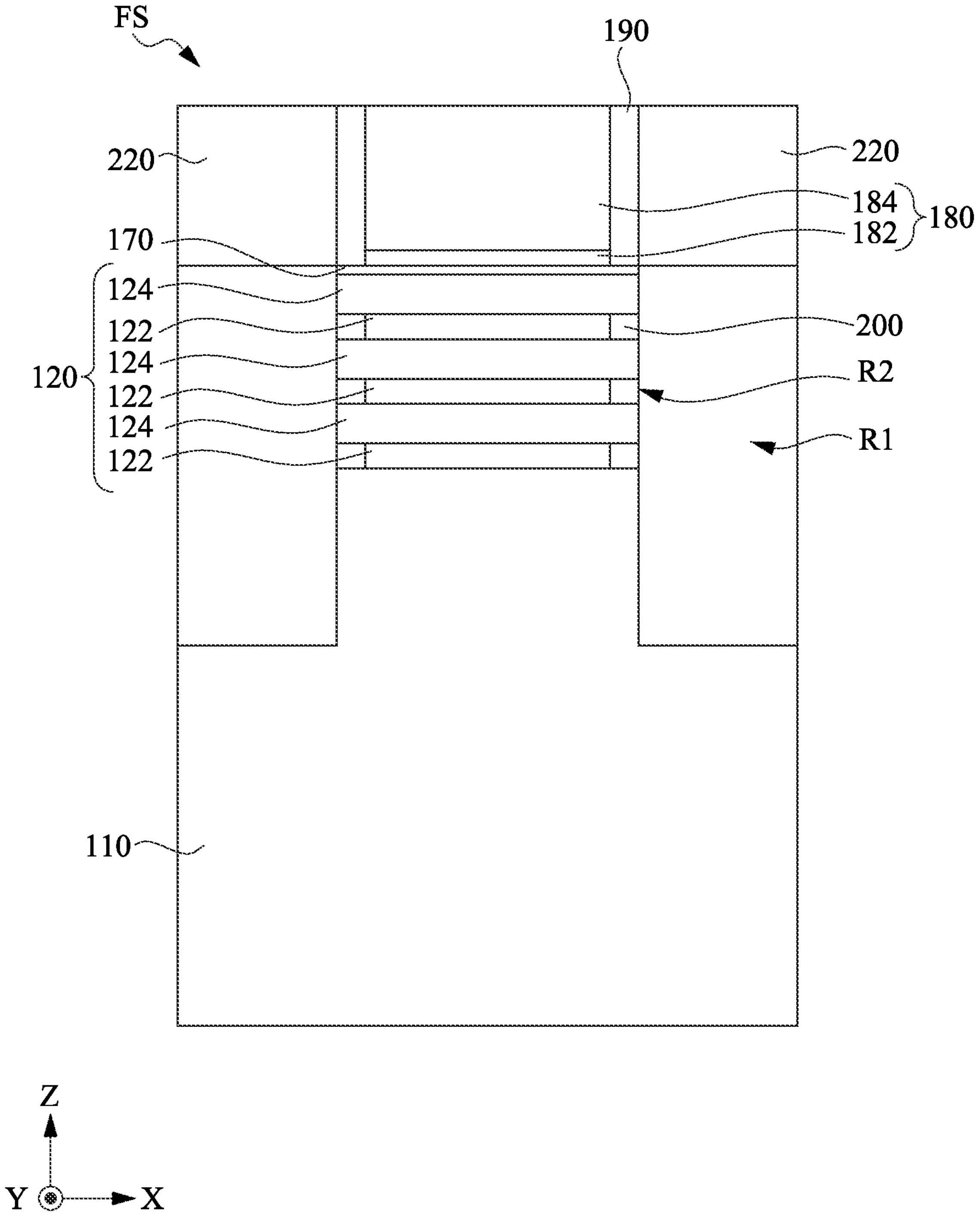

Reference is made to FIGS. 11A-11C. Exposed portions of the semiconductor fins FS that extend laterally beyond the gate spacers 190 (e.g., in source/drain regions of the fins FS) are etched by using, for example, an anisotropic etching process that uses the dummy gate structures 180 and the gate spacers 190 as an etch mask, resulting in recesses R1 into the semiconductor fins FS and between corresponding dummy gate structures 180. The recesses R1 may extend through the epitaxial layers 122 and the channel layers 124. After the anisotropic etching, end surfaces of the sacrificial layers 122 and end surfaces of channel layers 124 are exposed and aligned with respective outermost sidewalls of the gate spacers 190, due to the anisotropic etching. In some embodiments, the anisotropic etching may be performed by a dry chemical etch (e.g., reactive-ion etching) with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

The sacrificial layers 122 are laterally or horizontally recessed by using suitable selective etching process, resulting in lateral/sidewall recesses R2 each vertically between corresponding channel layers 124. The lateral/sidewall recesses R2 may alternate with the channel layers 124. The various compositions in epitaxial layers result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The channel layers 124 may have a higher etch resistance to the etching process than that of the epitaxial layers 122. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower than oxidation rate of SiGe (or Ge), the channel layers 124 is not significantly etched by the process of laterally recessing the sacrificial layers 122. As a result, the channel layers 124 laterally extend past opposite end surfaces of the sacrificial layers 122.

Inner spacers 200 are formed in the recesses R2. Formation of the inner spacers 200 includes depositing an inner spacer material layer to fill the lateral/sidewall recesses R2, and performing an anisotropic etching process to trim the deposited inner spacer material layer. The remaining portions of the deposited inner spacer material layer are denoted as inner spacers 200. The inner spacers 200 may include a low-k dielectric material, such as $SiO_x$, SiON, SiOC, SiN, SiCN, or SiOCN, and may be formed by a suitable deposition method, such as ALD. The inner spacers 200 may serve to isolate metal gates from source/drain regions formed in subsequent processing.

Source/drain epitaxial structures 210 are formed in the recesses R1 on opposite sides of the channel layers 124 and on opposite sides of the dummy gate structures 180. The source/drain epitaxial structures 210 connects the channel layers 124. In some embodiments, the source/drain epitaxial structures 210 may include Ge, Si, GaAs, AlGaAs, SiGe, GaAsP, SiP, or other suitable material. The source/drain epitaxial structures 210 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 210 are not in-situ doped, an implantation process (i.e., a junction implant process) is performed to dope the source/drain epitaxial structures 210. The source/drain epitaxial structures 210 may be formed by performing an epitaxial growth process that provides an epitaxial material on the exposed surfaces of the fins FS. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate portion 112 and the channel layers 124 of the fins FS.

An interlayer dielectric (ILD) layer 220 is formed over the substrate 110 and filling the space between the dummy gate structures 180. In some embodiments, the ILD layer 220 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 220 may be deposited by a PECVD process or other suitable deposition technique. In some embodiments, after formation of the ILD layer 220, the semiconductor device may be subject to a high thermal budget process to anneal the ILD layer 220. After depositing the ILD layer 220, a planarization process may be performed to remove excessive materials of the ILD layer 220. For example, a planarization process includes a chemical mechanical planarization (CMP) process which removes portions of the ILD layer 220 overlying the dummy gate structures 180 and planarizes a top surface of the semiconductor device. The planarization process may also remove the hard mask 186 of the dummy gate structures 180 (referring to FIGS. 10A-10C) to expose the underlying dummy gate electrode 184. In some embodiments, prior to the formation of the ILD layer 220, a contact etch stop layer (CESL) is conformally deposited over the semiconductor device. The CESL may include a silicon nitride layer, silicon oxide layer, a silicon oxynitride layer, and/or other suitable materials having a different etch selectivity than the ILD layer 220. The CESL may be formed by plasma-enhanced chemical vapor deposition (PECVD) process and/or other suitable deposition or oxidation processes.

Figure 12A:
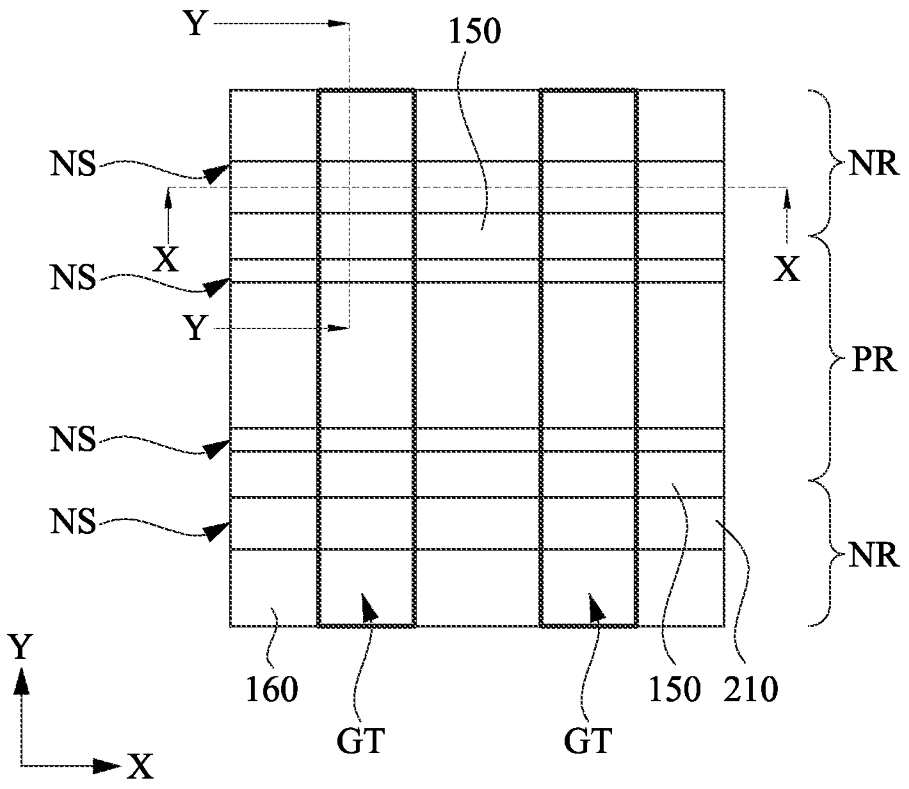

FIG. 12A-13C shows a gate replacement process. The dummy gate structures 180 and the sacrificial layers 122 (referring to FIGS. 11A-11C) are replaced with high-k/metal gate structures 230. Reference is made to FIGS. 12A-12C. The dummy gate structures 180 (referring to FIGS. 11A-11C) are removed, followed by removing the sacrificial layers 122 (referring to FIGS. 11A-11C). In the illustrated embodiments, the dummy gate structures 180 (referring to FIGS. 11A-11C) are removed by using a selective etching process (e.g., selective dry etching, selective wet etching, or a combination thereof) that etches the materials in dummy gate structures 180 (referring to FIGS. 11A-11C) at a faster etch rate than it etches other materials (e.g., gate spacers 190 and/or the ILD layer 220), thus resulting in gate trenches GT between corresponding gate spacers 190, with the sacrificial layers 122 (referring to FIGS. 11A-11C) exposed in the gate trenches GT. Subsequently, the sacrificial layers 122 (referring to FIGS. 11A-11C) in the gate trenches GT are etched by using another selective etching process that etches the sacrificial layers 122 at a faster etch rate than it etches the channel layers 124, thus forming openings/spaces O1 between neighboring channel layers 124. The openings/spaces O1 may expose the sidewalls of the inner spacers 200. In this way, the channel layers 124 become nanosheets suspended over the substrate 110 and between the source/drain epitaxial structures 210. According to the pattern of fins FS (referring to FIG. 11A), plural subsects of channel layers 124 (denoted as nanosheet subsets NS) remain over the substrate 110. This step is also called a channel release process. The channel release process is performed to leave a first nanosheet subset NS on a first side of the dielectric wall 152 and a second nanosheet subset NS on a second side of the dielectric wall 152. At this interim processing step, the openings/spaces O1 between nanosheets 124 may be filled with ambient environment conditions (e.g., air, nitrogen, etc).

In some embodiments, the sacrificial layers 122 (referring to FIGS. 11B and 11C) are removed by using a selective dry etching process. In some embodiments, the sacrificial layers 122 (referring to FIGS. 11B and 11C) are SiGe and the channel layers 124 are silicon allowing for the selective removal of the sacrificial layers 122 (referring to FIGS. 11B and 11C). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layers 122 are fully removed.

Figure 13A:
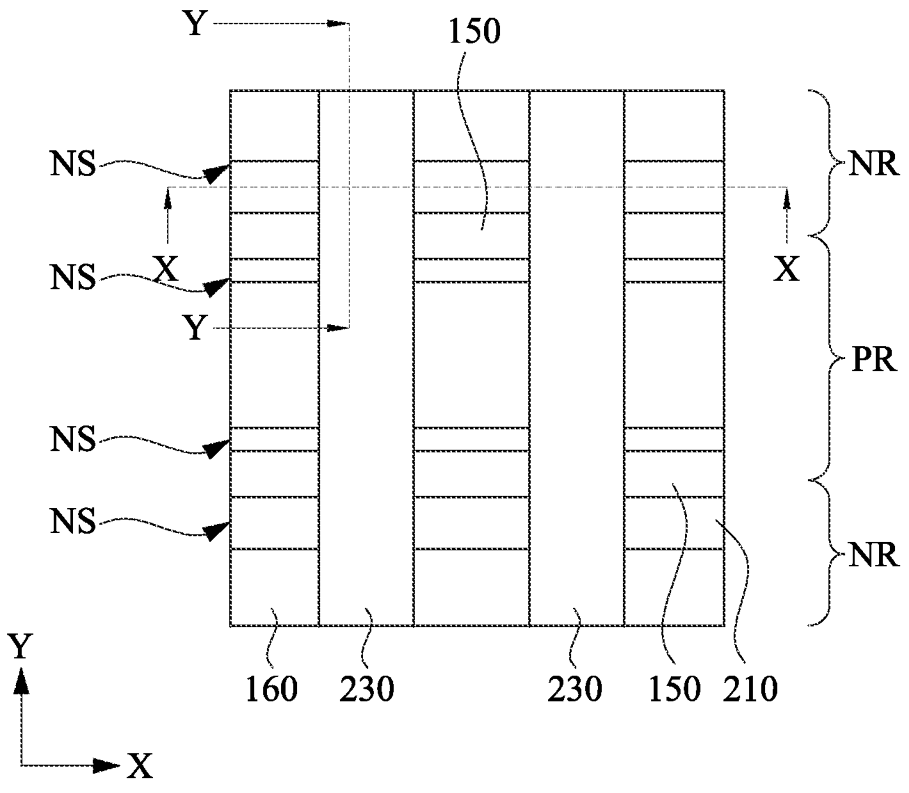
Figure 13B:
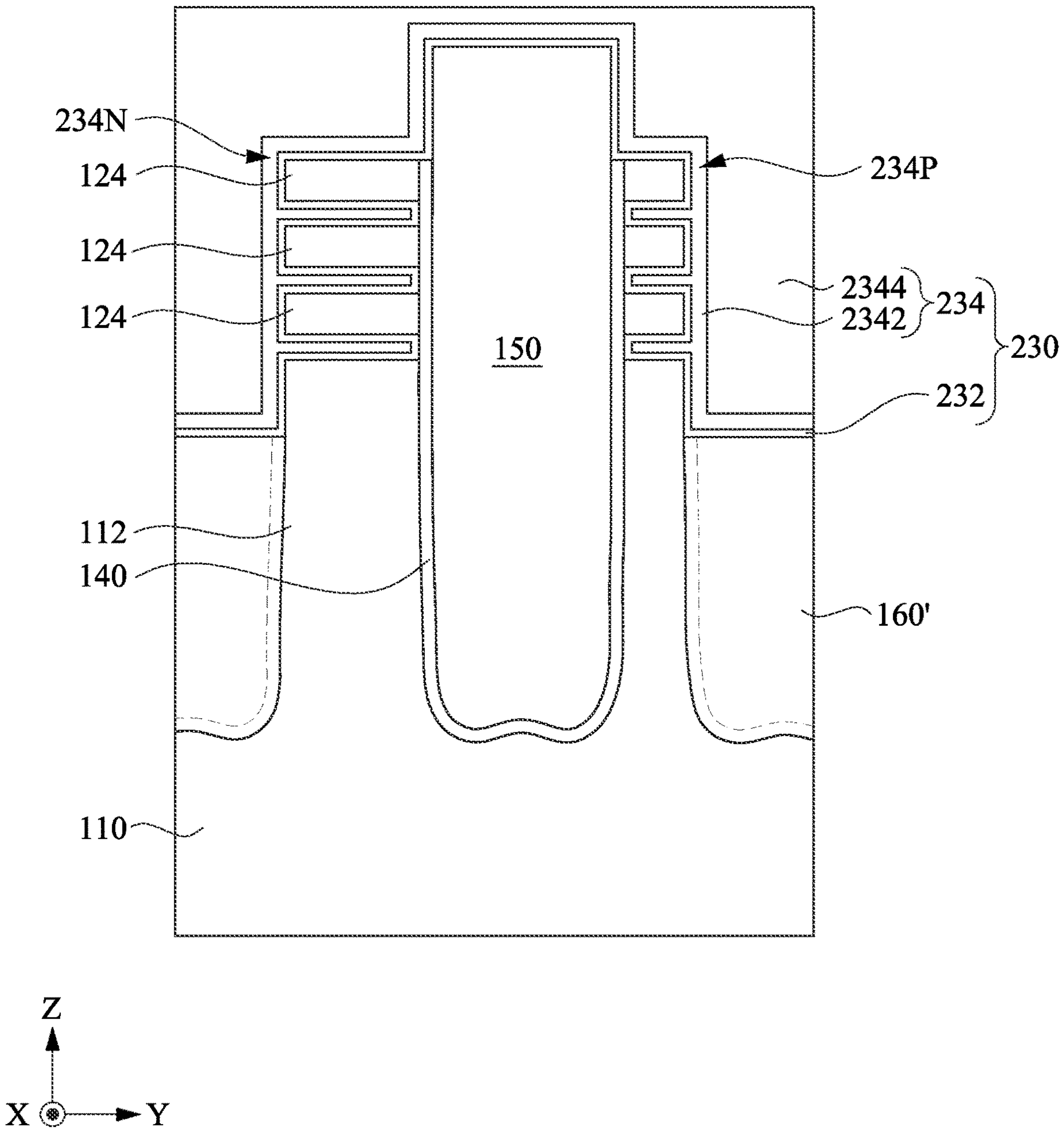
Figure 13C:
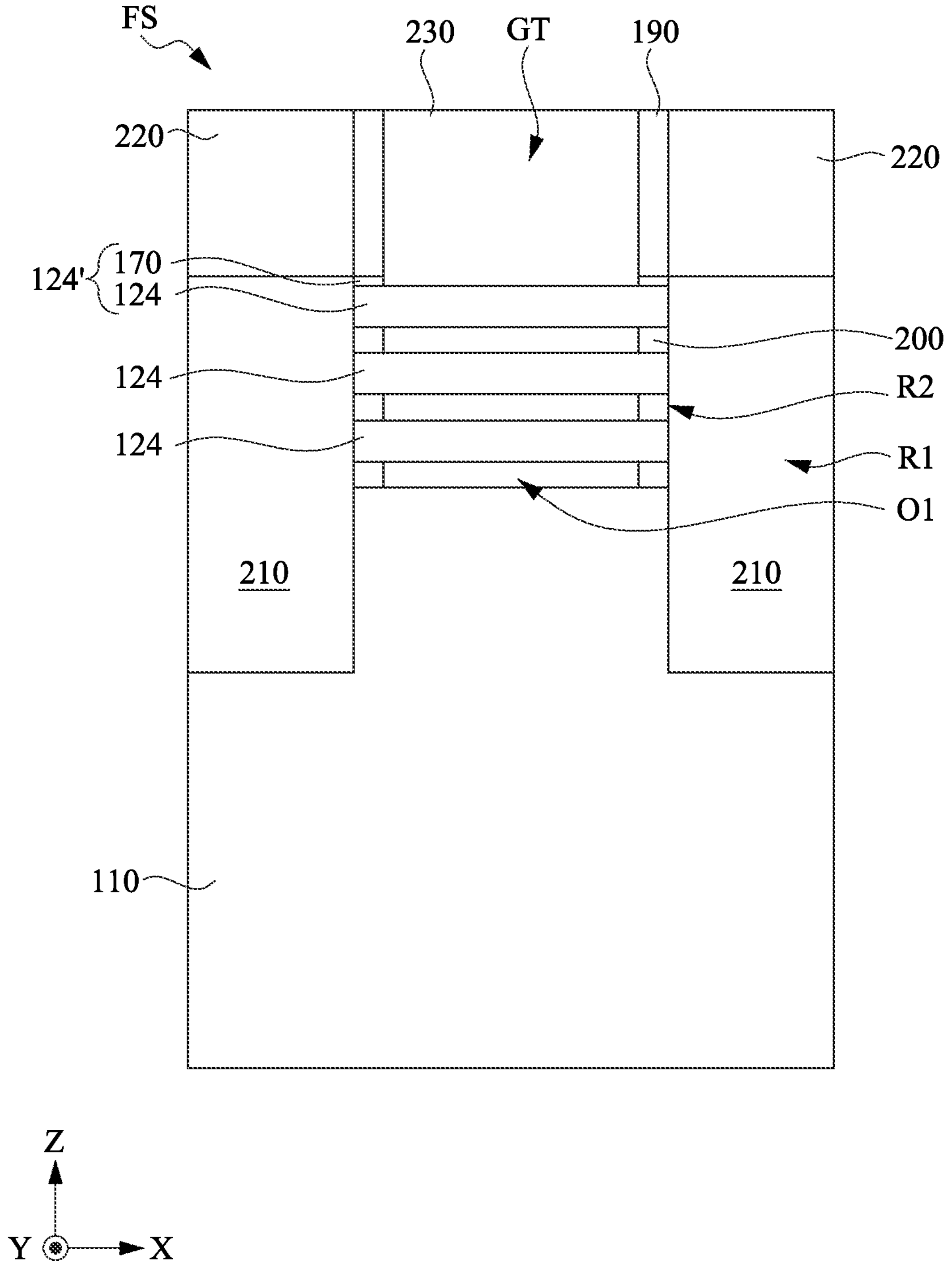

Reference is made to FIGS. 13A-13C. Replacement gate structures 230 are respectively formed in the gate trenches GT to surround each of the nanosheets 124 suspended in the gate trenches GT. The gate structures 230 may be final gates of GAA FETs. The final gate structure may be a high-k/metal gate stack, however other compositions are possible. In some embodiments, each of the gate structures 230 forms the gate associated with the multi-channels provided by the plurality of nanosheets 124. For example, the high-k/metal gate structures 230 are formed within the openings/spaces O1 provided by the release of nanosheets 124. The high-k/metal gate structures 230 may be between the nanosheets 124 and surrounded by the inner spacers 200.

In various embodiments, the high-k/metal gate structures 230 includes a gate dielectric layer 232 formed around the nanosheets 124 and a gate metal layer 234 formed around the gate dielectric layer 232 and filling a remainder of gate trenches GT. Formation of the high-k/metal gate structures 230 may include one or more deposition processes to form various gate materials, followed by a CMP process to remove excessive gate materials, resulting in the high-k/metal gate structures 230 having top surfaces level with a top surface of the ILD layer 220. In the present embodiments, the CMP process is performed such that the top surfaces of the high-k/metal gate structures 230 is higher than a top surface of the dielectric wall 150. In some other embodiments, the CMP process is performed such that the top surfaces of the high-k/metal gate structures 230 is level with the top surface of the dielectric wall 150. Thus, transistors (e.g., GAA FET) are formed, and the high-k/metal gate structures 230 surrounds each of the nanosheets 124, and thus is referred to as a gate of the transistors (e.g., GAA FET).

The gate dielectric layer 232 may include an interfacial layer and a high-k gate dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the nanosheets 124 and the substrate 110 exposed in the gate trenches GT are oxidized into silicon oxide to form interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 234 includes one or more metal layers. For example, the gate metal layer 234 may include one or more work function metal layers 2342 stacked one over another and a fill metal 2344 filling up a remainder of gate trenches GT. The one or more work function metal layers 2342 in the gate metal layer 234 provide a suitable work function for the high-k/metal gate structures 230. The gate metal layer 234 is denoted as gate metal layers 234N and 234P for n-type devices and p-type devices, respectively. For an n-type GAA FET, the gate metal layer 234N may include one or more n-type work function metal (N-metal) layers 2342. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. On the other hand, for a p-type GAA FET, the gate metal layer 234P may include one or more p-type work function metal (P-metal) layers 2342. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the gate metal layers 234N and 234P may include the same work function metal layers 2342 for n-type devices and p-type devices. In some embodiments, the gate metal layers 234N and 234P may include different work function metal layers 2342 for n-type devices and p-type devices. In some embodiments, the fill metal 2344 in the gate metal layer 234 (e.g., the gate metal layer 234N and/or 234P) may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. The gate metal layers 234N and 234P may include the same fill metal 2344 for n-type devices and p-type devices.

Figure 12B:
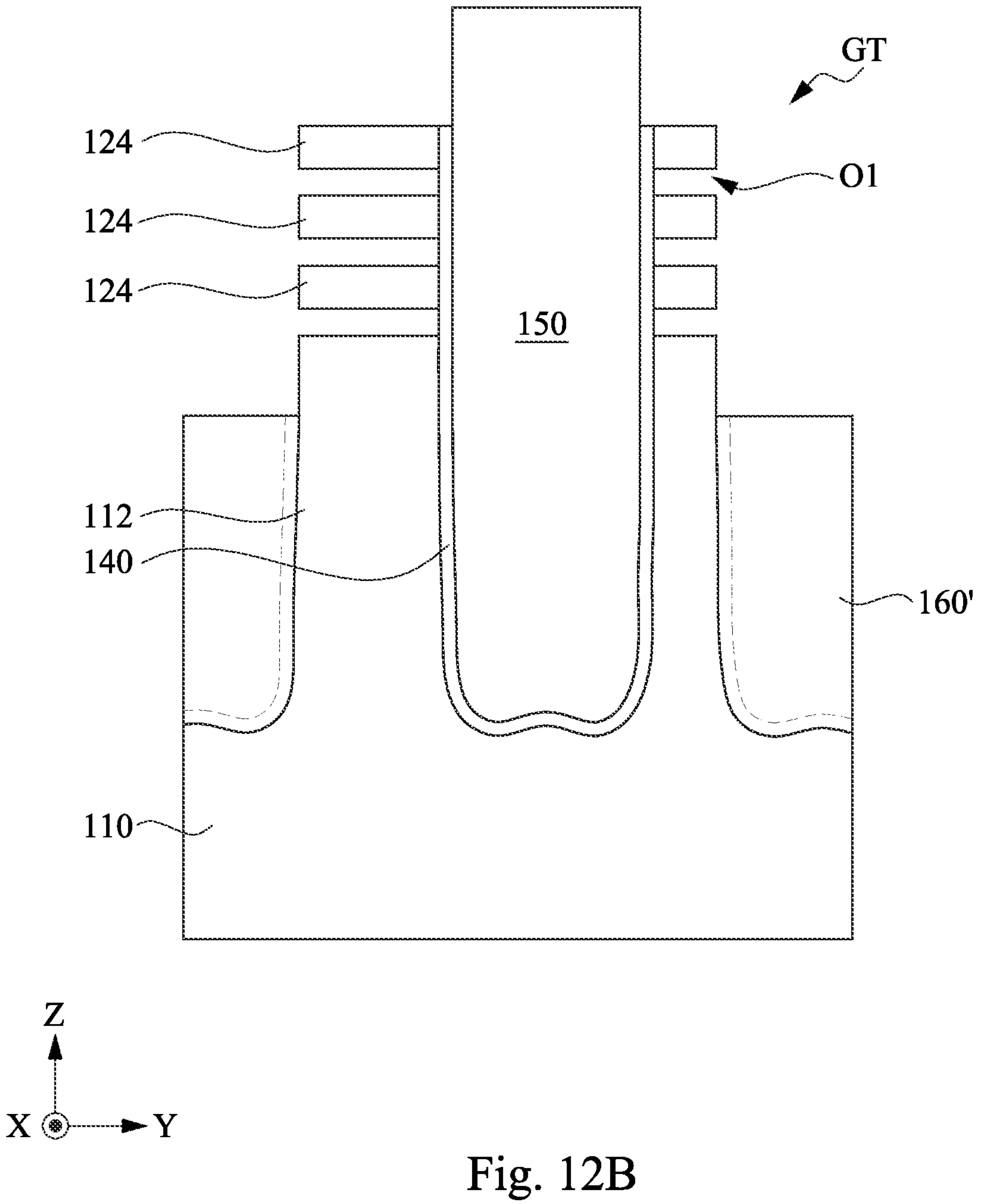
Figure 12C:
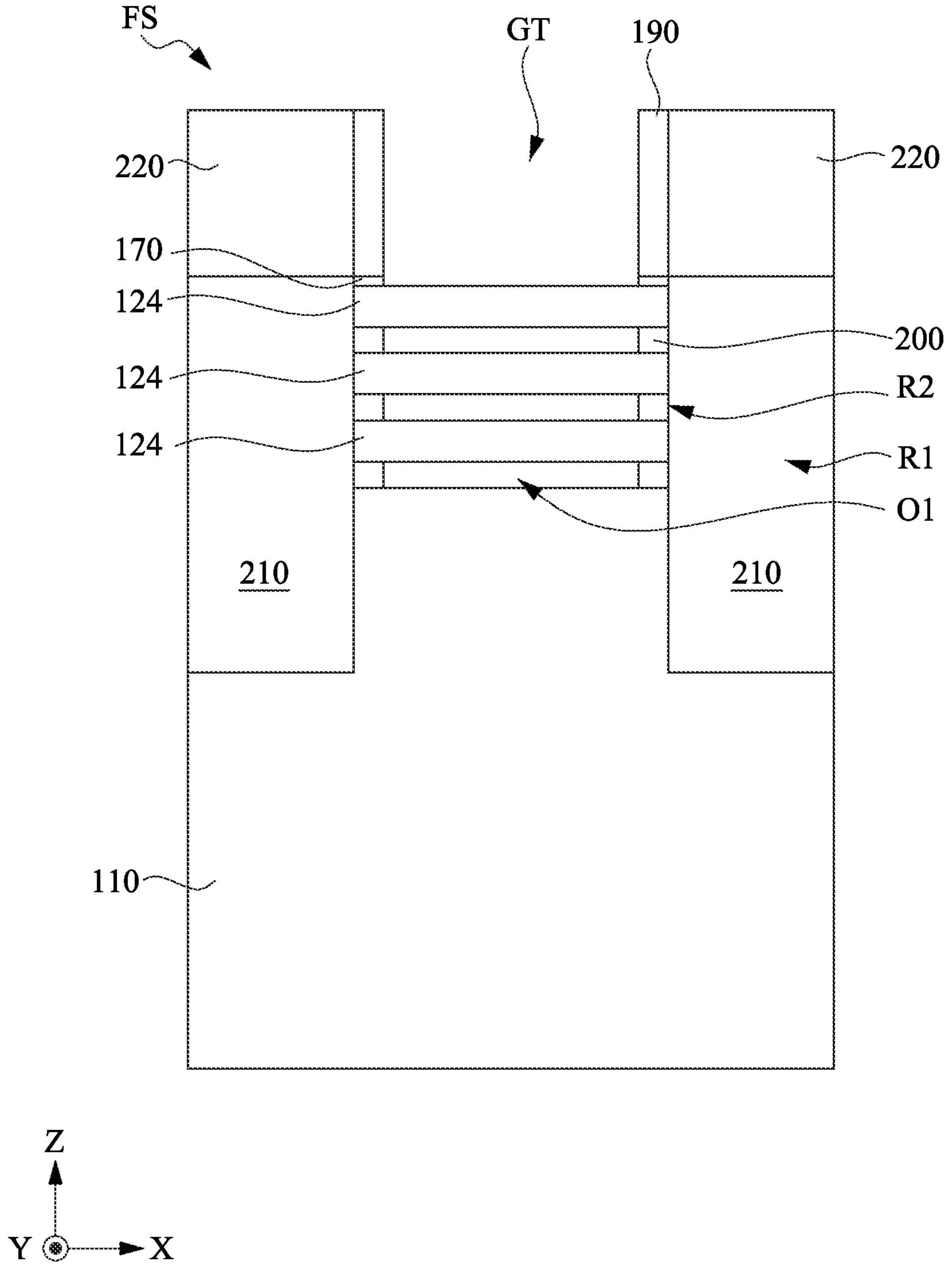

In some embodiments, a portion or an entirety of the protection layer 170 may be consumed during the channel release process in FIGS. 12A-12C and/or the process of the formation of the interfacial layer of the gate dielectric layer 232 in FIGS. 13A-13C. For example, during the channel release process, prior to the selective dry etching that removes the SiGe layers, a (silicon) breaking through process is performed to remove silicon liners on top and sidewalls of the fins FS, thereby exposing the fins FS to the gate trench GT. The silicon breaking through process may also remove a portion of the protection layer 170 around the dielectric wall 150. In some example, during the formation of the interfacial layer of the gate dielectric layer 232, a portion or an entirety of the protection layer 170 is oxided to be the interfacial layer by thermal oxidation process. As a result, at the middle region wrapped by the high-k/metal gate structures 230, the topmost channel layer 124 may have no portion of the protection layer 170 thereon in some embodiments. Stated differently, the middle region of the topmost channel layer 124 is free of the coverage of the protection layer 170. In some embodiments, at the edge region between the gate spacer 190 and the inner spacer 200, the topmost channel layer 124 may have a portion of the protection layer 170 thereon. In some embodiments where the channel layer 124 and the protection layer 170 include semiconductor materials (e.g., Si), a combination of the topmost channel layer 124 and the protection layer 170 may be referred to as a topmost channel layer 124'. The topmost channel layer 124' may have an edge portion between the gate spacer 190 and the inner spacer 200 and a middle region wrapped by the high-k/metal gate structures 230. In some embodiment, the edge portions of the topmost channel layer 124' is thicker than the middle region of the topmost channel layer 124', the middle portion of the topmost channel layer 124' have substantially the same thickness as the underlying channel layers 124, while the edge portions of the topmost channel layer 124' is thicker than the underlying channel layers 124. In some alternative embodiment, the edge portions and the middle portion of the topmost channel layer 124' is thicker than the underlying channel layers 124.

Figure 13D:
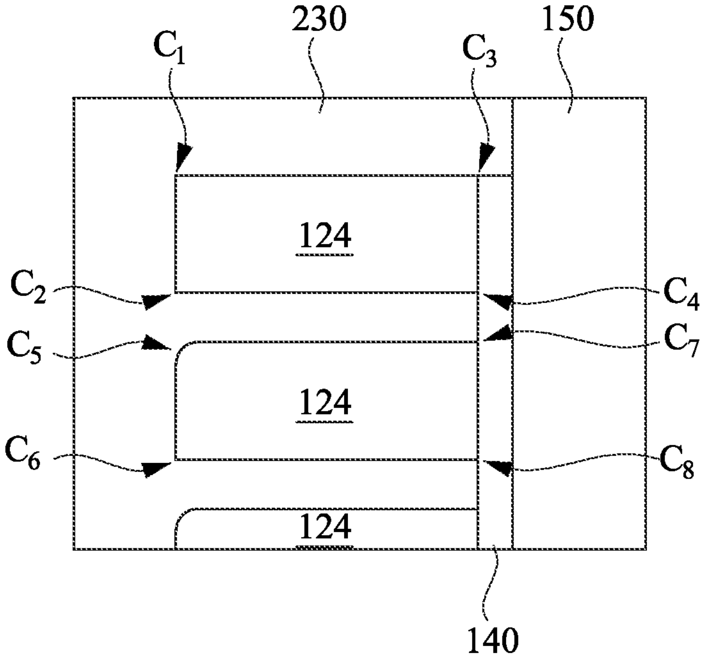

FIG. 13D is an enlarged view of a portion B of FIG. 13B. With the protection of the protection layer 170 (referring to FIG. 8), corners C3, C4, C7, C8 of the channel layer 124 at the wall side can be protected from being rounded. In some embodiments, the corners C1, C2, C5, C6 of the channel layer 124 of the channel layers 124 away from the dielectric wall 150 are more rounded than the corners C3, C4, C7, C8 of the channel layers 124 adjacent the dielectric wall 150 at wall side. Stated differently, the corners C3, C4, C7, C8 of the channel layers 124 adjacent the dielectric wall 150 are more angled than the corners C1, C2, C5, C6 of the channel layer 124 of the channel layers 124 away from the dielectric wall 150. In some embodiments, the corner radius of the corners C3, C4, C7, C8 are less than the corner radius of the corners C1, C2, C5, C6. For example, the corner radius of the corners C3, C4, C7. C8 is less than about 1 nanometer. For example, a vertical distance between a top end of the dielectric liner 140 and a top surface of the top channel layer 124 is less than about 1 nanometer.

Figure 14A:
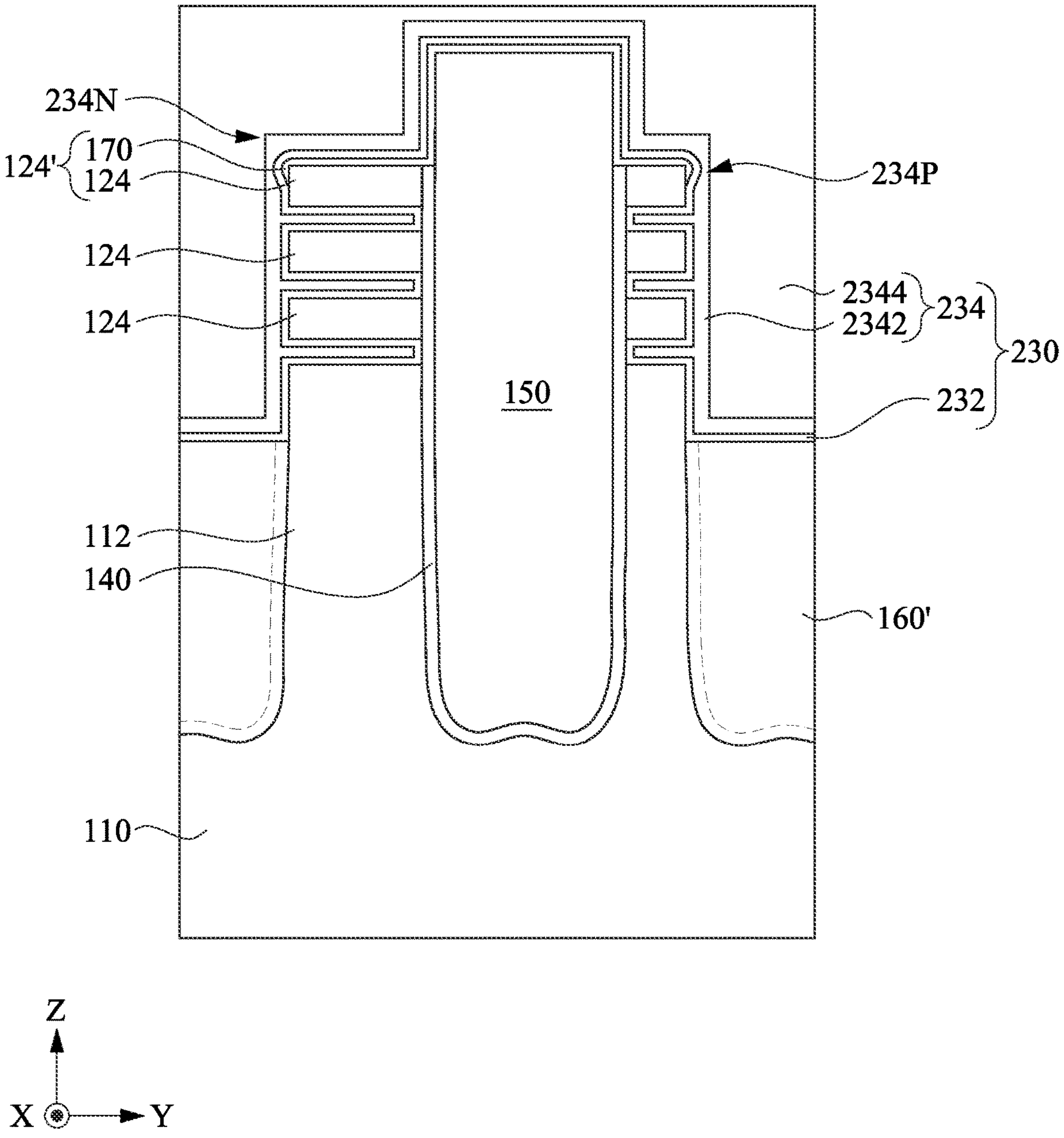
FIGS. 14A and 14B illustrate cross-sectional views of a semiconductor device in accordance with some embodiments of the present disclosure.
Figure 14B:
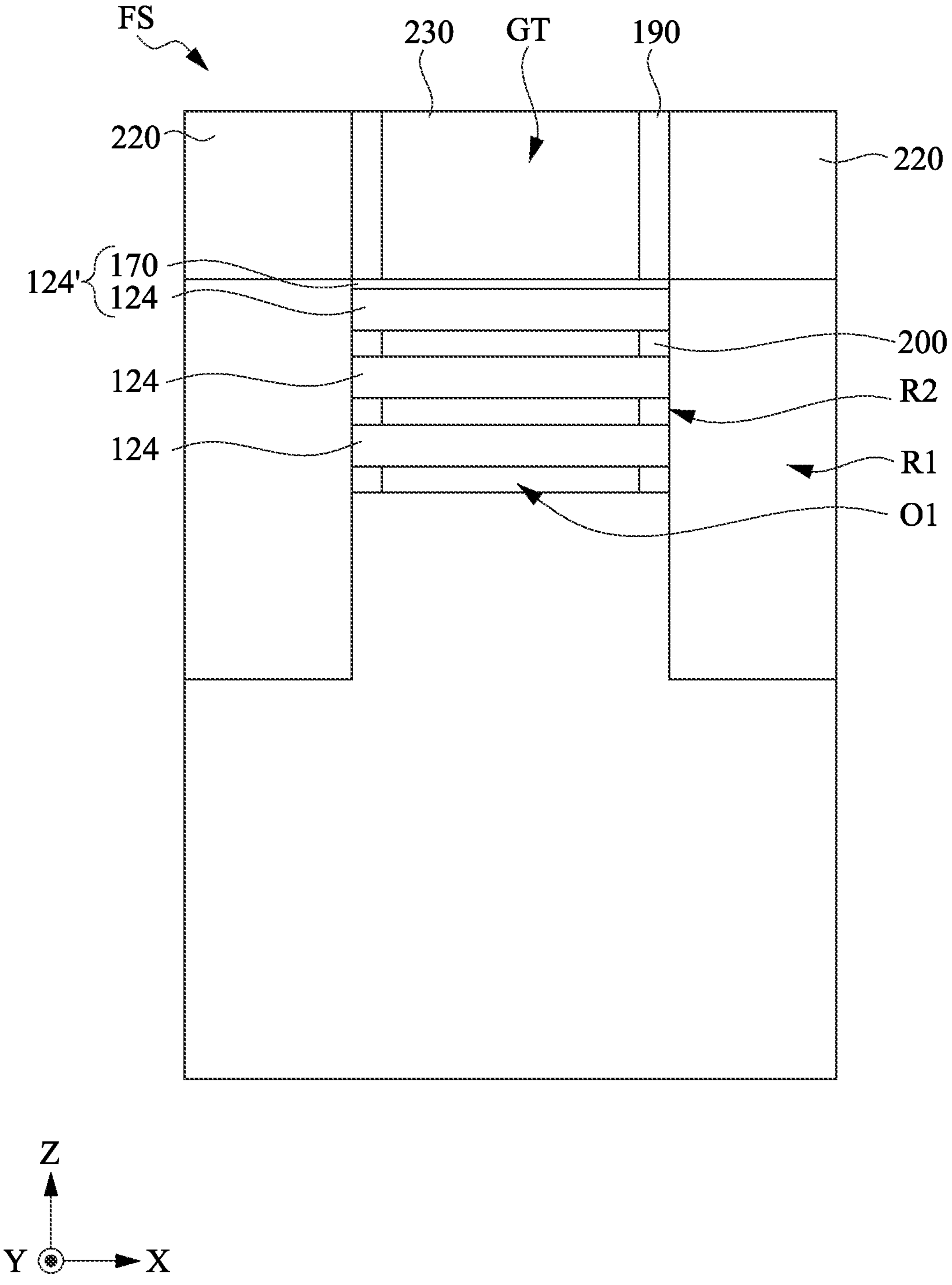

FIGS. 14A and 14B illustrate cross-sectional views of a semiconductor device in accordance with some embodiments of the present disclosure. Details of the present embodiments are similar to those illustrated in FIGS. 1-13D, except that the protection layer 170 may remain covering the topmost channel layer 124. In some embodiments, the protection layer 170 may not be substantially consumed during the fabrication process (e.g., the channel release process in FIGS. 12A-12C and/or the process of the formation of the interfacial layer of the gate dielectric layer 232 in FIGS. 13A-13C). In some embodiments, the protection layer 170 may include a dielectric material free of oxygen (e.g., $Si_3N_4$) that would not be removed by the break through process and/or the oxidation process of the interfacial layer. In some embodiments, the protection layer 170 may include a semiconductor material (e.g., Si) but not entirely removed by the break through process and/or the oxidation process of the interfacial layer. In some embodiments where the channel layer 124 and the protection layer 170 include semiconductor materials (e.g., Si), a combination of the topmost channel layer 124 and the protection layer 170 may be referred to as a topmost channel layer 124'. In some embodiments, in FIG. 14B, the edge portions of the topmost channel layer 124' (between the gate spacer 190 and the inner spacer 200) have substantially the same thickness as the middle region of the topmost channel layer 124' (wrapped by the high-k/metal gate structures 230), while the middle portion and the edge portions of the topmost channel layer 124' is thicker than the underlying channel layers 124. In some alternative embodiments, in FIG. 14B, the edge portions of the topmost channel layer 124' is thicker than the middle region of the topmost channel layer 124', while the middle portion and the edge portions of the topmost channel layer 124' is thicker than the underlying channel layers 124. Other details of the present embodiments are similar to those mentioned in previous embodiments, and thereto not repeated herein.

Figure 15:
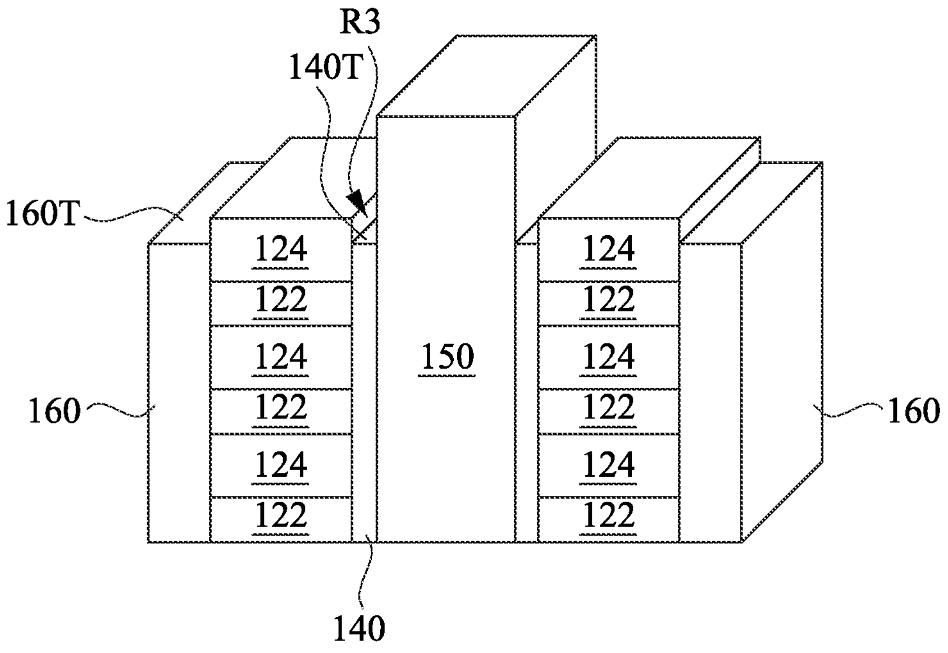
FIGS. 15-17 illustrates schematic views of intermediate stages in the manufacture of a semiconductor device in accordance with some embodiments of the present disclosure.
Figure 16A:
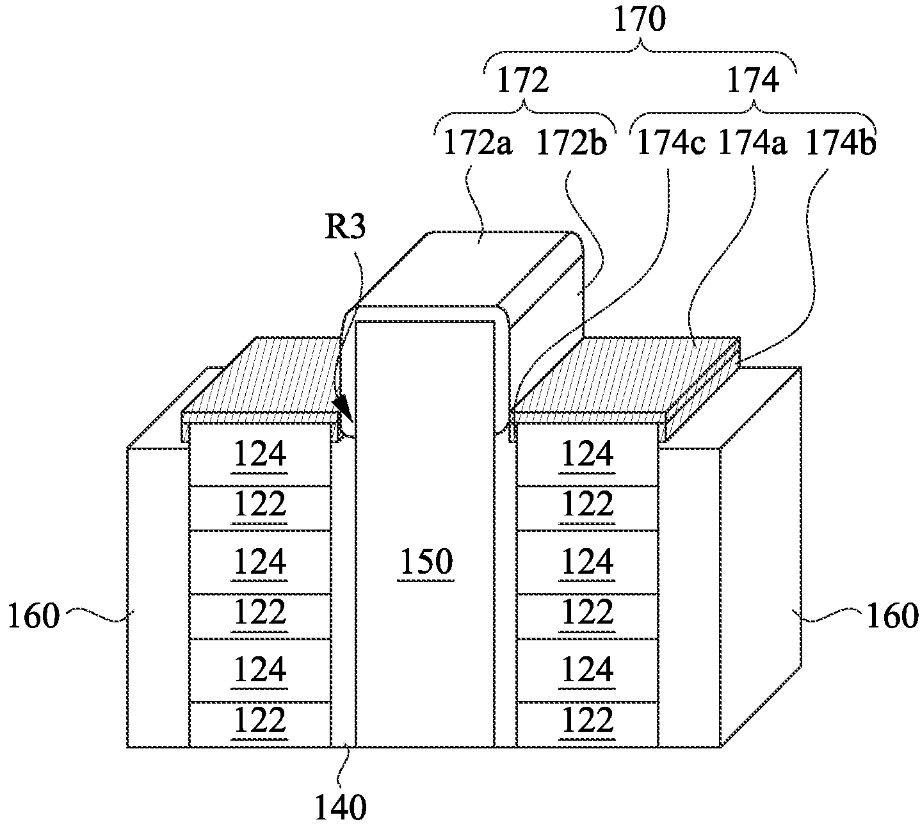
Figure 16B:
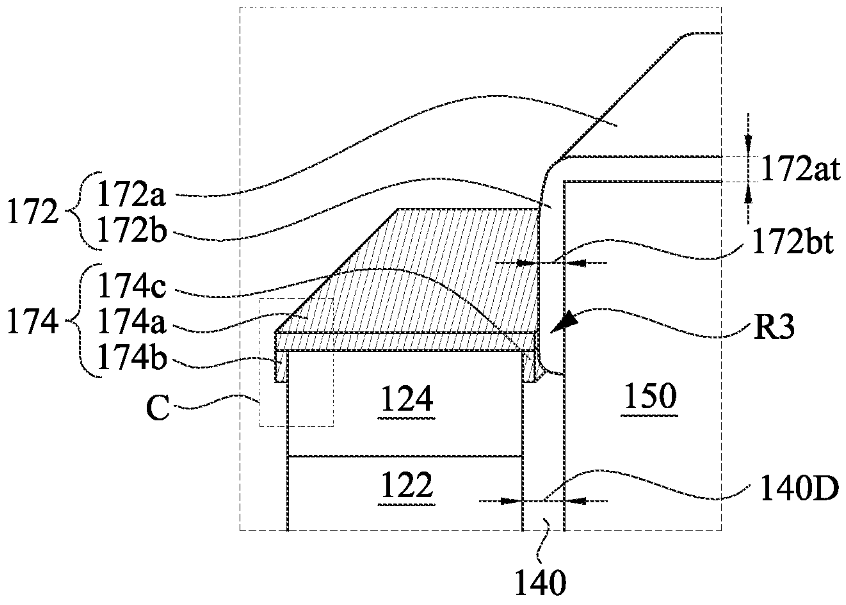
Figure 16C:
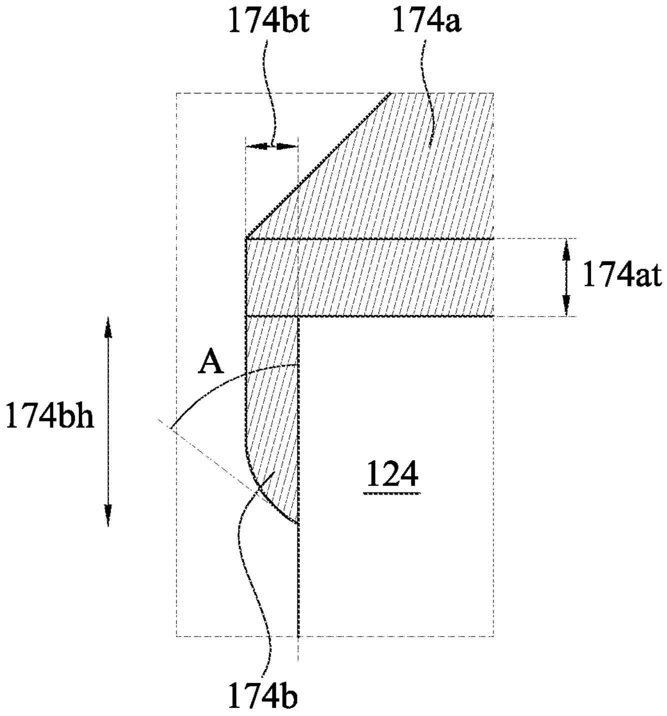
Figure 17:
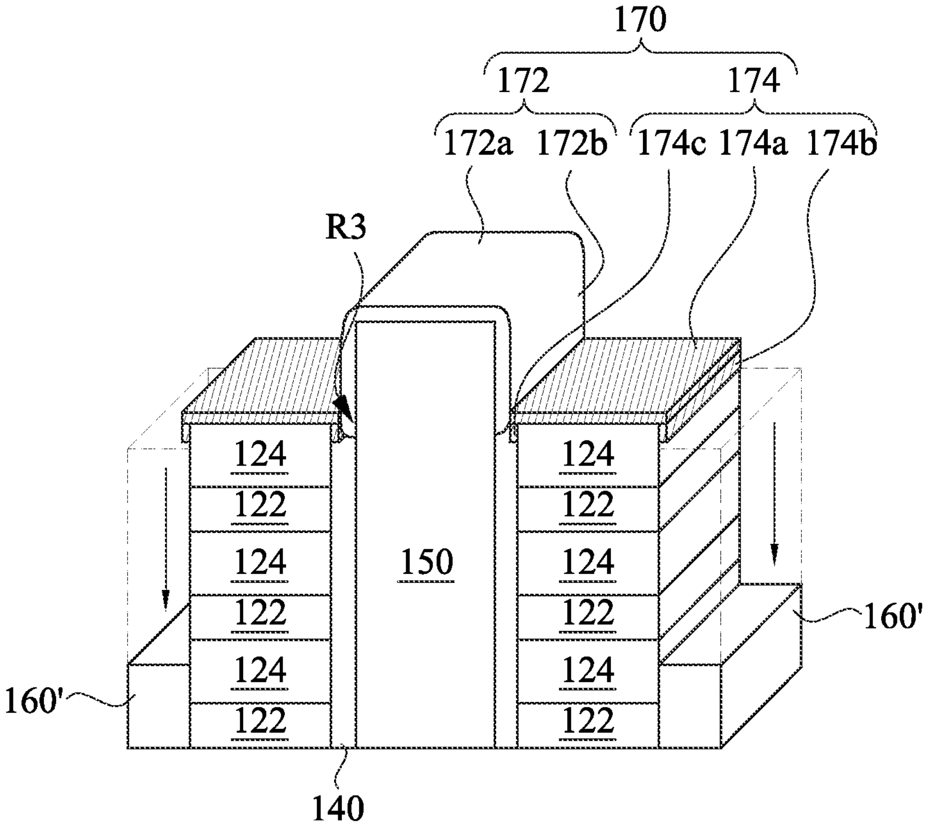

FIGS. 15-17 illustrates schematic views of intermediate stages in the manufacture of a semiconductor device in accordance with some embodiments of the present disclosure. Details of the present embodiments are similar to those illustrated in FIGS. 1-13D, except that a recess R3 is defined by the dielectric liner 140, the top channel layer 124, and the dielectric wall 150 after the oxide cleaning process illustrated in FIG. 7. In the present embodiments, the protection layer 170 is formed into the recess R3.

Reference is made to FIG. 15. An oxide cleaning process is performed to remove the oxide layers 132 (referring to FIG. 6), thereby exposing a top surface of the topmost channel layer 124. The oxide cleaning process may remove top portions of the dielectric liners 140 and top portions of the dielectric structure 160. After the oxide cleaning process, the top surfaces 160T of the dielectric structure 160 and the top ends 140T of the dielectric liners 140 may be lower than top surfaces of the topmost channel layers 124 and higher than bottom surfaces of the topmost channel layers 124. As a result, recesses R3 are formed over the recessed dielectric liners 140 and defined by the top channel layer 124 and the dielectric wall 150. In some embodiments, due to the limited space exposing the top ends 140T of the dielectric liners 140, the top surfaces of the dielectric structure 160 may be lower than the top ends 140T of the dielectric liners 140. In some other embodiments, the top surfaces of the dielectric structure 160 may be level with the top ends 140T of the dielectric liners 140, and lower than the top surfaces of the topmost channel layers 124. Other details of the oxide cleaning process are similar to those illustrated with FIG. 7, and therefore not repeated herein.

Reference is made to FIG. 16A. A protection layer 170 is deposited over the exposed top surface and exposed sidewall of the topmost channel layer 124. In some embodiments, it is easier to deposit a material of the protection layer 170 on surfaces of nitride materials and semiconductor materials than on a surface of oxide materials. For example, the protection layer 170 has a first portion 172 surrounding the dielectric wall 150 and a second portion 174 surrounding the exposed top surface and exposed sidewalls of the topmost channel layer 124. The first portion 172 and the second portion 174 of the protection layer 170 may extend into the recess R3. And, the deposited protection layer 170 may have little or no material over the dielectric structure 160. The deposition of the protection layer 170 can be performed in-situ immediately following the oxide cleaning process depicted in FIG. 15.

In the embodiments where the protection layer 170 includes a semiconductor material, the first portion 172 of the protection layer 170 is amorphous, and the second portion 174 of the protection layer 170 is crystalline. For example, the amorphous portion 172 of the protection layer 170 has an amorphous part 172*a* over a top surface of the dielectric wall 150, an amorphous part 172*b* on a sidewall of the dielectric wall 150. The crystalline portion 174 of the protection layer 170 has a crystalline part 174*a* over a top surface of the topmost channel layer 124, a crystalline part 174*b* on a sidewall of the topmost channel layer 124 away from the dielectric wall 150, and a crystalline part 174*c* on a sidewall of the topmost channel layer 124 facing the dielectric wall 150. In the present embodiments, a lower section of the amorphous part 172*b* and the crystalline part 174*c* are in the recess R3. An interface may be found between the lower section of the amorphous part 172*b* and the crystalline part 174*c* in the recess R3. It may be found that the topmost sheet (e.g., a combination of the crystalline portion 174 and the topmost channel layer 124) has an overhang profile.

FIG. 16B is an enlarged view of a portion of FIG. 16A. FIG. 16C is an enlarged view of a portion C of FIG. 16B. In the present embodiments, the protection layer 170 is deposited such that a sum of a thickness 174*bt* of the crystalline part 174*b* and a thickness 172*bt* of the amorphous part 172*b* is greater than a thickness 140D of the dielectric liner 140. As the crystalline parts 174*b* and 174*c* are epitaxially grown by the same deposition process from opposite sides of the channel layer 124, in some embodiments, the crystalline part 174*c* may have a thickness substantially equal to the thickness 174*bt*. In some embodiments, the crystalline part 174*c* may have a thickness less than the thickness 174*bt* due to the limited space in recess R3. Through the design, the crystalline part 174*c* and the lower section of the amorphous part 172*b* may fill up the recess R3.

In some embodiments, since the growth rate of amorphous silicon is larger than the growth rate of crystalline silicon, the thickness 174*bt* of the crystalline part 174*b*/174*c* is less than the thickness 172*bt* of the amorphous part 172*b*. It can be designed that the thickness 174*bt* of the crystalline part 174*b*/174*c* is less than half a thickness 140D of the dielectric liner 140 and greater than zero. Through the design, the crystalline part 174*c* and the lower section of the amorphous part 172*b* may fill up the recess R3.

In some embodiments, a height 174*bh* of the crystalline part 174*b* may be in a range from about 0 nanometer to a sum of a thickness of the channel layer 124 and a thickness of the sacrificial layer 122. In some further embodiments, a height 174*bh* of the crystalline part 174*b* may be in a range from about 0 nanometer to about a thickness of the channel layer 124, in which the thickness of the channel layer 124 may be in a range from about 1 nanometer to about 50 nanometers. If the height 174*bh* of the crystalline part 174*b* is too large, the oxide cleaning process (referring to FIGS. 6 and 15) may cause the dielectric liner dishing issues resulting leakage and worsen the device performance.

In some embodiments, the thickness 172*at* of the amorphous part 172*a* may be substantially equal to the thickness 172*bt* of the amorphous part 172*b*. In some embodiments, the thickness 174*at* of the crystalline part 174*a* may be substantially equal to the thickness 174*bt* of the crystalline part 174*b*/174*c*. However, other possible ranges are within the scope of the present disclosure. For example, the thickness 172*at* of the amorphous part 172*a* may be greater or less than the thickness 172*bt* of the amorphous part 172*b*. For example, the thickness 174*at* of the crystalline part 174*a* may be greater or less than the thickness 174*bt* of the crystalline part 174*b*/174*c*. In some embodiments, a bottom surface of the crystalline part 174*b* may have an angle A with respect to a direction NS normal to the substrate 110. The angle A may be in a range from about 0 degree to about 90 degrees.

Reference is made to FIG. 17. An etching back process is performed to remove a top portion of the dielectric structure 160 (referring to FIG. 16A) above the substrate portion 112, thereby recessing the dielectric structure 160 (referring to FIG. 16A). In some embodiments, a recessing depth is controlled (e.g., by controlling an etching time) so as to result in a desired height of the exposed upper portion of the fins FS. In the illustrated embodiments, the desired height exposes each of the layers 122 and 124 of the epitaxial stack 120 in the fins FS. Due to the etch selectivity between the protection layer 170 and the dielectric structure 160 (referring to FIG. 16A), the etching back process may not substantially damage the protection layer 170. The protection layer 170 may protect underlying topmost channel layer 124 and the dielectric liner 140 from being etched. After the etching back process, the remaining portions of the dielectric structure 160 (referring to FIG. 16A) may be referred to as shallow trench isolation (STI) structures 160'. In some embodiments of the present disclosure, with the protection of the protection layer 170 (referring to FIG. 16A), the dielectric liner 140 between the dielectric wall 150 and the channel layers 124 is prevented from being etched during the etching back process in FIG. 17. Thus, the leakage issue can be addressed, thereby improving the device performance. Other details of the present embodiments are similar to those illustrated with FIGS. 1-13D, and therefore not repeated herein.

Figure 18A:
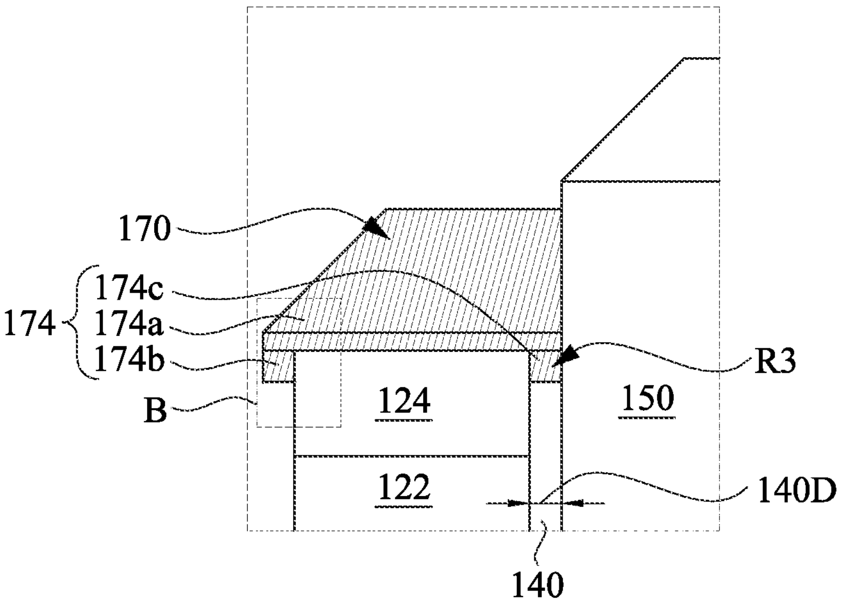
FIG. 18A illustrates a schematic view of a portion of a semiconductor device in accordance with some embodiments of the present disclosure.

FIG. 18A illustrates a schematic view of a portion of a semiconductor device in accordance with some embodiments of the present disclosure. Details of the present embodiments are similar to those illustrated in FIG. 15-17, except that the protection layer 170 merely have a portion 174 surrounding the exposed top surface and exposed sidewalls of the topmost channel layer 124. The second portion 174 of the protection layer 170 may extend into the recess R3. In the present embodiments, during the deposition of the protection layer 170 (as illustrated in FIGS. 8 and 16A), it is easier to deposit a material of the protection layer 170 on surfaces of semiconductor materials than on a surface of oxide materials and nitride materials. Thus, the deposited protection layer 170 may have little or no material over the dielectric structure 160 (as illustrated in FIGS. 8 and 16A) and little or no material over the dielectric structure around the dielectric wall 150.

Figure 18B:
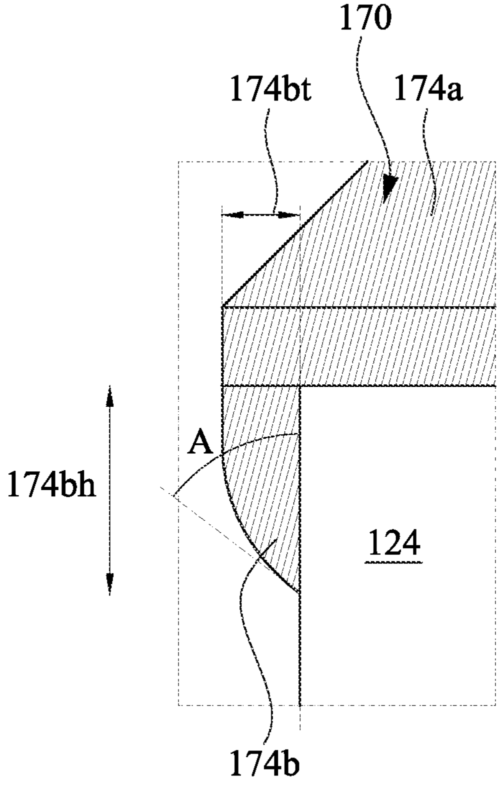
FIG. 18B is an enlarged view of a portion B of FIG. 18A.

FIG. 18B is an enlarged view of a portion B of FIG. 18A. In the present embodiments, the protection layer 170 is deposited such that a thickness 174*bt* of the crystalline part 174*b* is greater than a thickness 140D of the dielectric liner 140. The epitaxial growth of the crystalline part 174*c* is confined in the recess R3 and have a thickness substantially equal to the thickness 140D of the dielectric liner 140. Through the design, the crystalline part 174*c* may fill up the recess R3. In some embodiments, the thickness 174*at* of the crystalline part 174*a* may be substantially equal to the thickness 174*bt* of the crystalline part 174*b*/174*c*. However, other possible ranges are within the scope of the present disclosure. For example, the thickness 174*at* of the crystalline part 174*a* may be greater or less than the thickness 174*bt* of the crystalline part 174*b*/174*c*. Other details of the present embodiments are similar to those illustrated with FIGS. 1-13D and FIGS. 15-17, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that with the protection of the protection layer, the dielectric liner between the dielectric wall and the channel layers is prevented from being etched during the STI etching back process. Thus, the leakage issue from oxide dishing can be addressed, thereby improving the device performance.

According to some embodiments of the present disclosure, a method for manufacturing a semiconductor device is provided. The method includes forming an epitaxial stack over a substrate, the epitaxial stack comprising alternating sacrificial layers and channel layers; patterning the epitaxial stack into a first fin and a second fin; forming a dielectric wall between the first and second fins; forming a dielectric structure surrounding the first and second fins; depositing a protection layer over the first and second fins; after depositing the protection layer, etching back the dielectric structure to exposes sidewalls of the sacrificial layers; and replacing the sacrificial layers with a gate structure.

According to some embodiments of the present disclosure, a method for manufacturing a semiconductor device is provided. The method includes forming an epitaxial stack over a substrate, the epitaxial stack comprising alternating sacrificial layers and channel layers; patterning the epitaxial stack into a first fin and a second fin; depositing a dielectric liner over the first and second fins; forming a dielectric wall between the first and second fins and over the dielectric liner; forming a dielectric structure surrounding the first and second fins; recessing a top surface of the dielectric structure and a top end of the dielectric liner; depositing a protection layer over the first fin, wherein the protection layer covers the recessed top end of the dielectric liner; after depositing the protection layer, etching back the dielectric structure; and forming a gate structure over the first fin.

According to some embodiments of the present disclosure, a semiconductor device includes a substrate, a dielectric wall, first semiconductor channels, second semiconductor channels, a dielectric liner, a first gate structure, and a second gate structure. The dielectric wall is on the substrate. The first semiconductor channels on a first side of the dielectric wall. The second semiconductor channels on a second side of the dielectric wall. A dielectric liner spaces the first semiconductor channels from the first side of the dielectric wall and spaces the second semiconductor channels from the second side of the dielectric wall. A top end of the dielectric liner is substantially level with a topmost one of the first semiconductor channels. The first gate structure wraps around the first semiconductor channels. The second gate structure wraps around second semiconductor channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

- forming an epitaxial stack over a substrate, the epitaxial stack comprising alternating sacrificial layers and channel layers;
- patterning the epitaxial stack into a first fin and a second fin;
- depositing a dielectric liner over the first and second fin;
- forming a dielectric wall between the first and second fins and over the dielectric liner;
- forming a dielectric structure surrounding the first and second fins;
- recessing a top surface of the dielectric structure and a top end of the dielectric liner;
- depositing a protection layer over the first and second fins, wherein the protection layer covers the recessed top end of the dielectric liner;
- after depositing the protection layer, etching back the dielectric structure to expose sidewalls of the sacrificial layers; and
- replacing the sacrificial layers with a gate structure.

2. The method of claim 1, wherein recessing the top surface of the dielectric structure and the top end of the dielectric liner exposes a sidewall of a topmost one of the channel layers.

3. The method of claim 2, wherein depositing the protection layer is performed such that the protection layer is further on the exposed sidewall of the topmost one of the channel layers.

4. The method of claim 1, wherein depositing the protection layer is performed such that the protection layer has a crystalline portion over the epitaxial stack.

5. The method of claim 1, wherein depositing the protection layer is performed such that the protection layer is further over the dielectric wall.

6. The method of claim 5, wherein depositing the protection layer is performed such that the protection layer has an amorphous portion over the dielectric wall.

7. The method of claim 1, wherein depositing the protection layer is performed such that a top surface of the dielectric structure is free of coverage of the protection layer.

8. The method of claim 1, wherein the protection layer is a semiconductor layer.

9. The method of claim 1, wherein the protection layer comprises a dielectric material different from that of the dielectric structure.

10. A method for manufacturing a semiconductor device, comprising:

- forming an epitaxial stack over a substrate, the epitaxial stack comprising alternating sacrificial layers and channel layers;
- patterning the epitaxial stack into a first fin and a second fin;
- depositing a dielectric liner over the first and second fins;
- forming a dielectric wall between the first and second fins and over the dielectric liner;
- forming a dielectric structure surrounding the first and second fins;
- recessing a top surface of the dielectric structure and a top end of the dielectric liner;
- depositing a protection layer over the first fin, wherein the protection layer covers the recessed top end of the dielectric liner;
- after depositing the protection layer, etching back the dielectric structure; and
- forming a gate structure over the first fin.

11. The method of claim 10, wherein the recessed top end of the dielectric liner and the recessed top surface of the dielectric structure are laterally aligned with the topmost one of the channel layers.

12. The method of claim 10, wherein the recessed top end of the dielectric liner is higher than the recessed top surface of the dielectric structure.

13. The method of claim 10, wherein recessing the top surface of the dielectric structure and the top end of the dielectric liner is performed such that a recess is defined by the recessed top end of the dielectric liner, the dielectric wall, and the topmost one of the channel layers, and depositing the protection layer is performed such that the protection layer fills up the recess.

14. The method of claim 10, wherein forming the gate structure is performed such that the gate structure is over the protection layer.

15. The method of claim 10, wherein the protection layer comprises a material different from that of the dielectric structure and the dielectric liner.

16. The method of claim 10, wherein depositing the protection layer is performed such that a thickness of the protection layer is greater than a thickness of the dielectric liner.

17. The method of claim 10, wherein depositing the protection layer is performed such that a thickness of the protection layer is greater than half a thickness of the dielectric liner.

18. A semiconductor device, comprising:

a substrate;

a dielectric wall on the substrate;

a plurality of first semiconductor channels on a first side of the dielectric wall;

a plurality of second semiconductor channels on a second side of the dielectric wall;

a dielectric liner spacing the first semiconductor channels from the first side of the dielectric wall and spacing the second semiconductor channels from the second side of the dielectric wall, wherein a top end of the dielectric liner is substantially level with a topmost one of the first semiconductor channels, and the top end of the dielectric liner is lower than a top surface of the dielectric wall;

a first gate structure wrapping around the first semiconductor channels; and a second gate structure wrapping around second semiconductor channels, wherein a first corner of the first semiconductor channels away from the first side of the dielectric wall is more rounded than a corner of the first semiconductor channels adjacent to the first side of the dielectric wall.

19. The semiconductor device of claim 18, further comprises:

a gate spacer at a sidewall of the first gate structure, wherein a thickness of a portion of the topmost one of the first semiconductor channels below the gate spacer is greater than a thickness of a second topmost one of the first semiconductor channels.

20. The semiconductor device of claim 18, wherein the plurality of first semiconductor channels comprise silicon.

* * * * *